(12) United States Patent
Huang

(10) Patent No.: US 9,991,165 B1
(45) Date of Patent: Jun. 5, 2018

(54) ASYMMETRIC SOURCE/DRAIN EPITAXY

(71) Applicant: Taiwan Semiconductor Manufacturing Company, Ltd., Hsinchu (TW)

(72) Inventor: Yu-Lien Huang, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days. days.

(21) Appl. No.: 15/592,899

(22) Filed: May 11, 2017

Related U.S. Application Data

(60) Provisional application No. 62/427,742, filed on Nov. 29, 2016.

(51) Int. Cl.
| | |
|---|---|
| *H01L 21/82* | (2006.01) |
| *H01L 21/8234* | (2006.01) |
| *H01L 29/08* | (2006.01) |
| *H01L 29/66* | (2006.01) |
| *H01L 27/088* | (2006.01) |

(52) U.S. Cl.
CPC ........ *H01L 21/823418* (2013.01); *H01L 21/823431* (2013.01); *H01L 21/823468* (2013.01); *H01L 27/0886* (2013.01); *H01L 29/0847* (2013.01); *H01L 29/66545* (2013.01)

(58) Field of Classification Search
CPC ......... H01L 21/82; H01L 21/02; H01L 21/28; H01L 21/265; H01L 21/266; H01L 21/283; H01L 21/324; H01L 21/308; H01L 21/311; H01L 21/3065; H01L 21/3105; H01L 21/8238; H01L 21/8234; H01L 21/823418; H01L 21/823431; H01L 21/823468
USPC ........................................... 257/401
See application file for complete search history.

(56) References Cited

U.S. PATENT DOCUMENTS

| | | | |
|---|---|---|---|
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 2014/0131776 A1* | 5/2014 | Ching | H01L 29/66545 257/288 |

(Continued)

*Primary Examiner* — Chuong A Luu
(74) *Attorney, Agent, or Firm* — Slater Matsil, LLP

(57) ABSTRACT

A method includes forming a plurality of fins on a substrate and a dummy gate structure over the fins. A spacer layer is formed over the dummy gate structure and the fins. The spacer layer is recessed to form asymmetrically recessed spacers along sidewalls of each of the fins, thereby exposing a portion of each of the fins. A source/drain epitaxy is grown on the exposed portions of the plurality of fins, a first source/drain epitaxy on a first fin being asymmetrical to a second source/drain epitaxy on a second fin. A device includes a first and second fin on a substrate with a gate structure formed over the first and second fins. An epitaxy if formed over the first fin and the second fin on the same side of the gate structure, where the height of the first epitaxy is greater than the height of the second epitaxy.

20 Claims, 24 Drawing Sheets

(56) References Cited

U.S. PATENT DOCUMENTS

2015/0380412 A1* 12/2015 Huang ............ H01L 21/823807
257/192
2016/0071952 A1* 3/2016 Yin ................... H01L 29/66795
438/283

* cited by examiner

ASYMMETRIC SOURCE/DRAIN EPITAXY

PRIORITY CLAIM AND CROSS-REFERENCE

This application claims the benefit of the following provisionally filed U.S. Patent application: Application Ser. No. 62/427,742, filed Nov. 29, 2016, entitled "Asymmetric Source/Drain Epitaxy," which application is hereby incorporated herein by reference.

BACKGROUND

The reduction of the size and the inherent features of semiconductor devices (e.g., field effect transistor (FET) devices) has enabled continued improvement in speed, performance, density, and cost per unit function of integrated circuits over the past few decades. In accordance with a design of the FET devices and one of the inherent characteristics thereof, modulating the length of a channel region underlying a gate between a source and drain of a FET device alters a resistance associated with the channel region, thereby affecting a performance of the FET device. More specifically, shortening the length of the channel region reduces a source-to-drain resistance of the FET device, which, assuming other parameters are maintained relatively constant, may allow an increase in current flow between the source and drain when a sufficient voltage is applied to the gate of the MOS device.

To further enhance the performance of FET devices, stress may be introduced in the channel region of a FET device to improve carrier mobility. A commonly used method for applying compressive stress to the channel regions of FET devices includes growing stressors in the source and drain regions. Such a method typically includes the steps of forming a gate stack on a semiconductor substrate, forming gate spacers on sidewalls of the gate stack, forming recesses in the silicon substrate along the gate spacers, and epitaxially growing stressors in the recesses. Since the stressors have a lattice constant different from that of silicon, it expands and applies a stress to the channel region, which is located between a source stressor and a drain stressor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
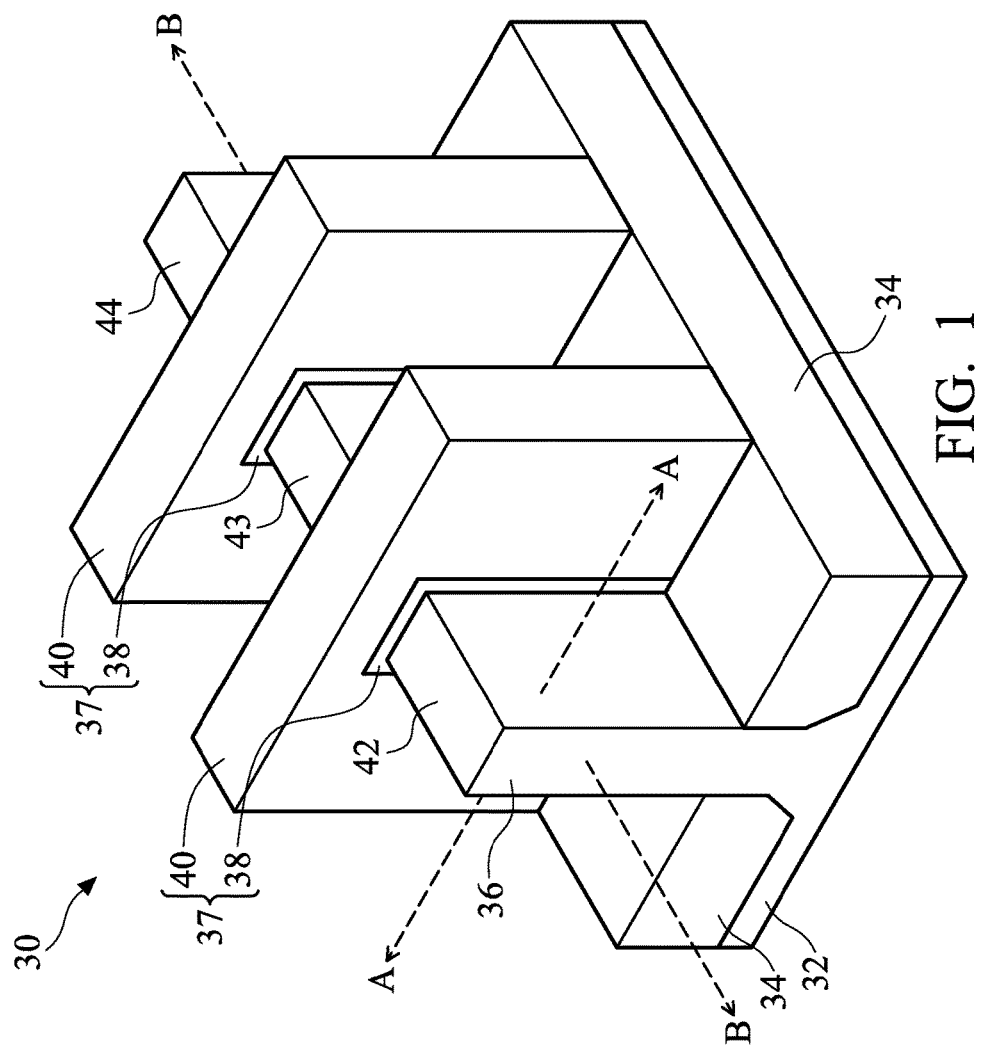
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide strain boost of the source/drain regions of a Fin Field Effect Transistor ("FinFET"). An epitaxy of source/drain regions can be grown asymmetrically at the peripheral area of a FinFET to achieve a greater overall strain boost at the source/drain regions of the FinFET. In some embodiments, the source/drain epitaxies of adjacent fins of a FinFET transistor device can be grown so as to maintain spacing between faceted surfaces of the source/drain epitaxies of adjacent fins. In some embodiments, the source/drain epitaxies can be grown so that the faceted surfaces meet, thereby producing a merged and enlarged continuous source/drain region of the transistor. In some embodiments, the epitaxy of an outer fin of a set of adjacent fins can be enlarged by recessing an outermost spacer to provide a greater surface for more epitaxial growth of the source/drain epitaxy. In some embodiments the epitaxy of the outer fin can be enlarged by reducing the spacer of the outer fin on both sides of the fin. These embodiments will be discussed in further detail below.

FIG. 1 illustrates an example of a FinFET 30 in a three-dimensional view as a reference illustration. The FinFET 30 comprises a fin 36 on a substrate 32. The substrate 32 includes isolation regions 34 formed thereon, and the fin 36 protrudes above and from between neighboring isolation regions 34. In this example, the FinFET 30 includes two gate structures 37, however the FinFET could include one gate structure or more than two gate structures. Similarly, in this example, the FinFET 30 contains one fin 36, however the FinFET could contain multiple fins. The gate structure 40 comprises gate dielectric 38 along sidewalls and over a top surface of the fin 36, and a gate electrode 40 over the gate dielectric 38. Source/drain regions 42 and 43 and source/drain regions 43 and 44 are areas of the fin 36 opposite sides of the gate 37. FIG. 1 further illustrates two reference cross-sections that are used in later figures. Cross-section A-A intersects the fin 36 along its width in the source/drain regions. Cross-section B-B bisects the fin 36 along its length. Subsequent figures refer to these reference cross-sections.

Figure 2A:
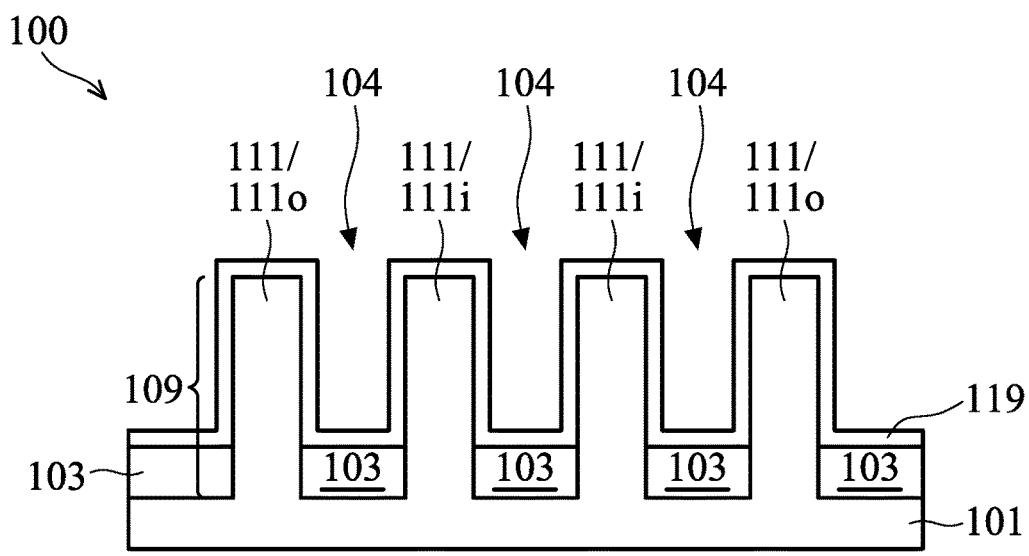
FIGS. 2A-8C illustrate a FinFET device in various intermediate steps of its manufacture process, in accordance with some embodiments.

FIGS. 2A-8C illustrate a FinFET device in various intermediate steps of its manufacture process, in accordance with some embodiments. FIG. 2A is a cross-section of a set of fins of a FinFET 100 across the width of the fins, corresponding to the A-A cross-section of FIG. 1. The illustration of FIG. 2A shows four fins 111 (111*i* interior fins and 111*o* outside fins), however, more or fewer fins can be included in the FinFET 100. Fins 111 are formed out of semiconductor substrate 101. FIG. 2A shows the FinFET device 100 in an intermediate step of the manufacture process.

Semiconductor substrate 101 can be part of a semiconductor wafer or a semiconductor device. In accordance with some embodiments of the present disclosure, semiconductor substrate 101 includes crystalline silicon. Other materials that can be used in the substrate 101 include Silicon, germanium, gallium, boron, arsenic, nitrogen, indium, and/or phosphorus, and the like. Semiconductor substrate 101 may also include other semiconductor materials such as III-V compound semiconductor materials. Semiconductor substrate 101 can be a bulk substrate or a Semiconductor-on-Insulator (SOI) substrate.

Furthermore, the substrate 101 may include other features. For example, the substrate may include various doped regions depending on design requirements (e.g., p-type substrate or n-type substrate). For example, the doped regions may be doped with p-type dopants, such as boron or $BF_2$, n-type dopants, such as phosphorus or arsenic, and/or combinations thereof. The doped regions may be configured for an n-type FinFET, or alternatively configured for a p-type FinFET.

The substrate 101 may be patterned using, for example, photolithography techniques. For example, a mask layer (not shown), such as a pad oxide layer and an overlying pad nitride layer, is formed over a major surface of the substrate 101. The pad oxides layer may be a thin film comprising silicon oxide formed, for example, using a thermal oxidation process. The pad oxide layer may act as an adhesion layer between the substrate 101 and the overlying pad nitride layer and may act as an etch stop layer for etching the pad nitride layer. In an embodiment, the pad nitride layer is formed of silicon nitride, for example, using low-pressure chemical vapor deposition (LPCVD) or plasma enhanced chemical vapor deposition (PECVD).

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is patterned to define the pad oxide and pad nitride.

The patterned mask is subsequently used to pattern exposed portions of the substrate 101 to form trenches 104, thereby defining semiconductor strips 109 between adjacent trenches 104 as illustrated in FIG. 2A. Semiconductor strips 109 are referred to as fins throughout the description. As will be discussed below, the trenches 104 will be subsequently filled with a dielectric material, forming isolation regions such as shallow trench isolation (STI) regions adjacent to the semiconductor strips 109. In some embodiments, the trenches 104 may be strips (viewed from the top) parallel to each other, and closely spaced with respect to each other. In some embodiments, the trenches 104 may be continuous and surrounding the semiconductor strips 109. In some embodiments, continuous trenches surrounding the semiconductor strips 109 may be formed in a subsequent process which cuts the semiconductor strips 109 to a particular length.

The semiconductor strips 109 may be patterned by any suitable method. For example, the semiconductor strips 109 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the fins.

Isolation regions (such as STI regions 103 prior to recessing, discussed below) may be formed in the trenches 104 to extend from the bottom of the trenches 104 to top surfaces of the semiconductor strips 109. The isolation regions may include a liner oxide (not shown). The liner oxide may be formed of a thermal oxide formed through a thermal oxidation of a surface layer of substrate 101. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 103 may also include a dielectric material over the liner oxide, wherein the dielectric material may be formed of Flowable Chemical Vapor Deposition (FCVD), spin-on, or the like.

In some embodiments, the isolation regions may be a silicon oxide layer formed using an HDPCVD process, using silane ($SiH_4$) and oxygen ($O_2$) as reacting precursors. In other embodiment, the isolation regions may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation regions may be formed using a spin-on-dielectric (SOD) process, such as hydrogen silsesquioxane (HSQ) or methyl silsesquioxane (MSQ). Other processes and materials may be used. A planarization process, such as a chemical mechanical polish (CMP) process, may be performed to remove excess materials to form the isolation regions, thereby making the top surfaces of the semiconductor strips 109 and top surfaces of the isolation regions substantially coplanar, within process variations.

Referring further to FIG. 2A, isolation regions are recessed to form STI regions 103, so that top portions of semiconductor strips 109 protrude higher than the top surfaces of STI regions 103 to form the protruding fins 111 as illustrated. The etching may be performed using one or more etching processes. For example, a dry etching process using $HF_3$ and $NH_3$ as the etching gases may be used in embodiments in which the STI regions 103 are formed of silicon oxide. Argon may also be included. In some embodiments, the recessing of STI regions 103 may be performed using a wet etch process, such as a diluted HF wet etch.

A spacer layer 119 is deposited over the fins 111, as further described below with respect to FIG. 2B.

Figure 2B:
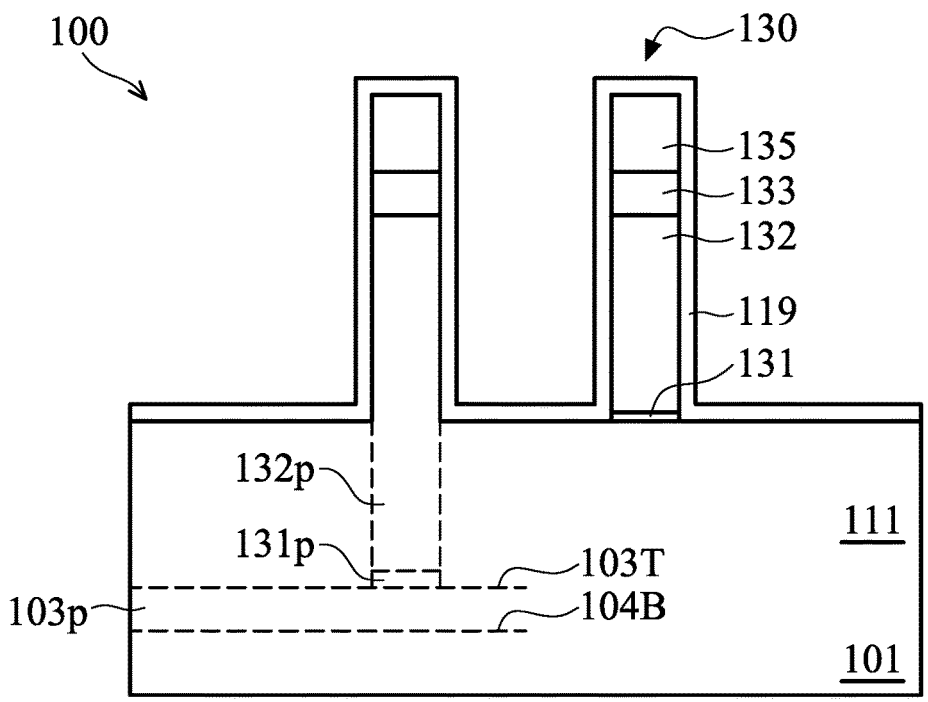

As illustrated in FIG. 2B, dummy gate stack 130 is formed on the top surfaces and the sidewalls of protruding fins 111. FIG. 2B is a cross-section of the structure of FIG. 2A. The cross-section in FIG. 2B is taken along the length of a fin 111*o* or fin 111*i*, providing a cut line similar to the B-B cross-section of FIG. 1. As will further be described below, a dummy gate stack 130 is formed over the fin 111. The gate stack 130 may include a dummy gate dielectric layer 131, a dummy gate electrode 132, an optional pad layer 133, and a hard mask 135. The spacer layer 119 is formed over the dummy gate stack 130. Although two dummy gate structures are shown, it should be understood that the structure can have just one gate stack or more than two gate stacks, such as three or four gate stacks or more. Dummy gate stack 130 may have a lengthwise direction substantially perpendicular (e.g., within process variations) to the lengthwise or longitudinal direction of protruding fins 111. Additional gate stacks may be parallel to each other.

The phantom lines depicted in FIG. 2B are shown for informational purposes and represent a partial projection from a cross-section through the trench 104 which is parallel to the fin 111 illustrated in FIG. 2B. The phantom bottom 104B of the trench 104 and the top 103T of the phantom STI regions 103$p$ are depicted. A phantom dummy gate dielectric layer 131$p$ and phantom dummy gate electrode 132$p$ are also depicted. As can be seen in FIG. 2B, the semiconductor strips 109, including the protruding fins 111 is above the substrate portion 101, however, in the length-wise cross-section through fin, the semiconductor strip 109 is indistinguishable from the substrate 101. These will not be illustrated in further figures for simplicity.

To form the gate stacks 130, a dummy dielectric layer can be formed on the top surfaces and the sidewalls of the protruding fins 111. Next, a dummy gate electrode layer can be blanket deposited over the dummy dielectric layer. An optional pad layer can be applied over the dummy gate layer. And a hard mask layer can be deposited over the pad layer.

The hard mask layer may be patterned using acceptable photolithography and etching techniques to form hard mask 135. Then the pad layer 133, dummy gate layer 132, and dummy gate dielectric layer 131 can be formed by patterning the pad layer, dummy gate electrode layer, and dummy dielectric layer, respectively, such as by transferring the pattern of the hard mask 135 by using an acceptable etching technique to form dummy gates stacks 130. The etching technique may comprise an acceptable anisotropic etching, such as reactive ion etch (RIE), inductively coupled plasma (ICP), or the like. The dummy gate stacks 130 cover respective channel regions of the fins 111. The dummy gates 130 may have a lengthwise direction substantially perpendicular to the lengthwise direction of the respective fins 111.

The dummy gate dielectric layer 131 may be, for example, silicon oxide, silicon nitride, a combination thereof, or the like, and may be deposited or thermally grown according to acceptable techniques, such as CVD, thermal oxidation, or the like. The dummy gate electrode layer 132 may be deposited, such as by using CVD or the like, over the dummy gate dielectric layer 131 and then planarized, such as by a CMP. The dummy gate electrode layer 132 may comprise, for example, polysilicon, although other materials that have a high etching selectivity may also be used. The pad layer 133 can be deposited, such as by using CVD or the like, over the dummy gate layer 132. The hard mask layer 135 layer may be deposited, such as by using CVD or the like, over the dummy gate layer or pad layer, if used. The pad layer 133 and hard mask layer 135 may comprise, for example, silicon nitride, silicon oxynitride, silicon carbon nitride, or the like, or combinations thereof.

Spacer layer 119 may be formed by depositing, such as by LPCVD, ALD, CVD, or the like, a spacer material. The spacer material may be formed of a dielectric material such as silicon nitride, silicon oxy-carbo-nitride (SiOCN), silicon carbon-nitride (SiCN), or a metal oxide such as aluminum oxide. In accordance with some embodiments of the present disclosure, spacer layer 119 is formed of SiOCN, and may have a single-layer structure. In accordance with some embodiments, spacer layer 119 has a composite structure including a plurality of layers. For example, spacer layer 119 may include a silicon oxide layer and a silicon nitride layer over the silicon oxide layer. In some embodiments, the horizontal portions and vertical portions of spacer layer 119 may have substantially the same thickness. In some embodiments, the horizontal and vertical portions of the spacer layer 119 may have different thicknesses.

As discussed further below, spacer layer 119 is etched to remove horizontal portions of the spacer layer 119. The remaining vertical portions of spacer layer 119 form gate spacers 123 on the sidewalls of dummy gate stack 130. Portions of the spacer layer 119 may remain adjacent to the fins 111, which is described below in greater detail with reference to FIGS. 3A-1 through 3A-7.

In some embodiments, a portion of the fins may be replaced with replacement fins. In such embodiments, an anisotropic etching step (referred to as source/drain recessing hereinafter) is performed to etch portions of protruding fins 111 that are not covered by dummy gate stack 130 and gate spacers 123. Portions of fins 111 directly underlying dummy gate stack 130 and gate spacers 123 are protected and are not etched. The top surfaces of the recessed semiconductor strips may be lower than the top surfaces of STI regions 103 in accordance with some embodiments, thereby forming recesses between STI regions 103. The recessed fins may be replaced by replacement fins (not shown) formed using an epitaxial process to selectively grow a semiconductor material in the recesses. The replacement fins may have a lattice constant different from the lattice constant of the substrate 101. The replacement fins may include silicon germanium or silicon. The replacement fins may be doped with a p-type or an n-type impurity in situ and/or after formation. After the recesses are filled with replacement fins, the further epitaxial growth of replacement fins may cause replacement fins to expand horizontally, and facets may be formed. Replacement fins include lower portions that are formed in STI regions 103 and upper portions that are formed over the top surfaces of STI regions 103 and over top surfaces of the spacers 121 (see FIGS. 3A-1 through 3A-7, discussed below). Lower portions, whose sidewalls are shaped by the shapes of the recesses, may have (substantially) straight edges, which may also be substantial vertical edges that are substantially perpendicular to the major surfaces of substrate 101.

Figures 1, 3A:
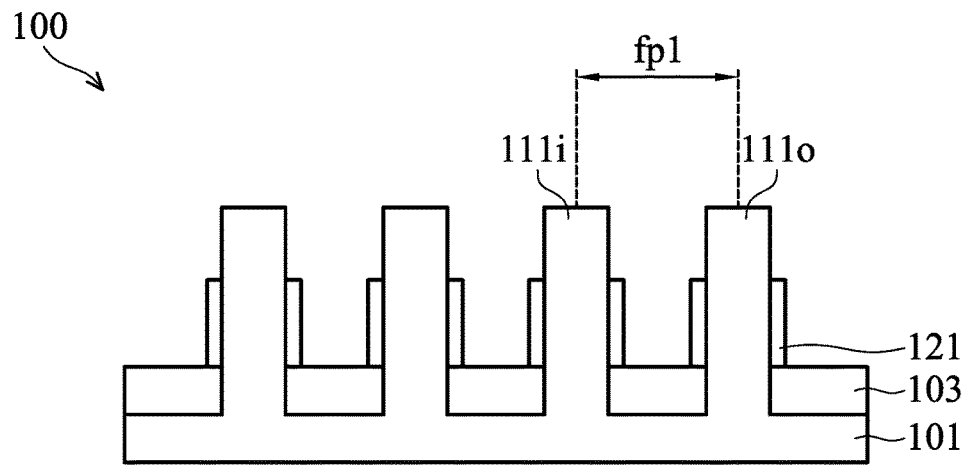
Figures 2, 3A:
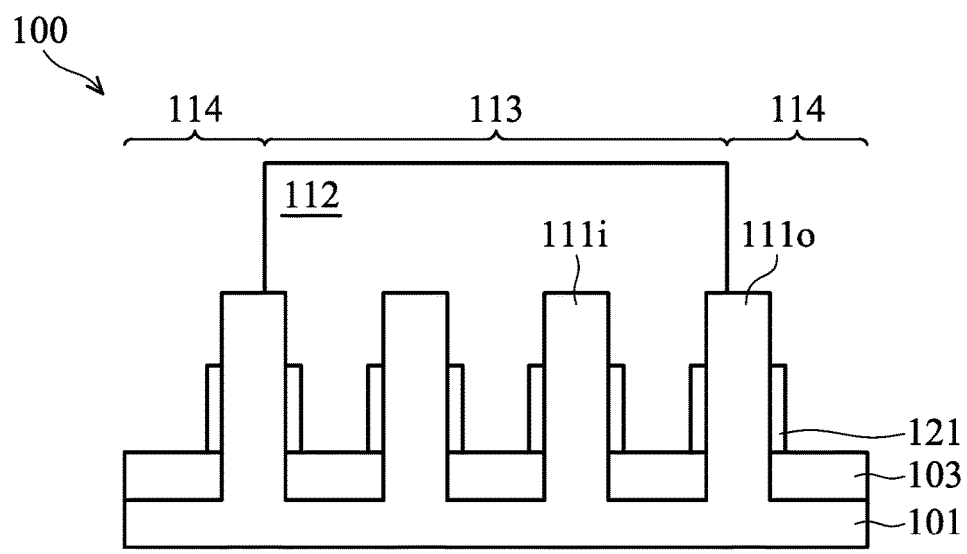
Figures 3, 3A:
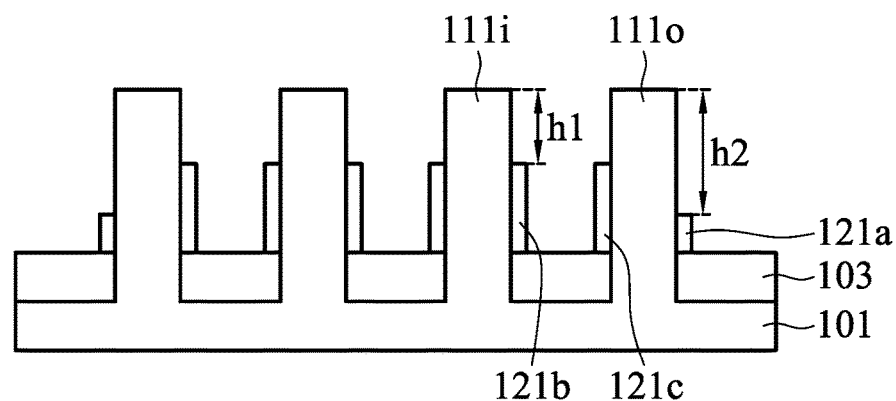
Figures 3, 3A, 4:
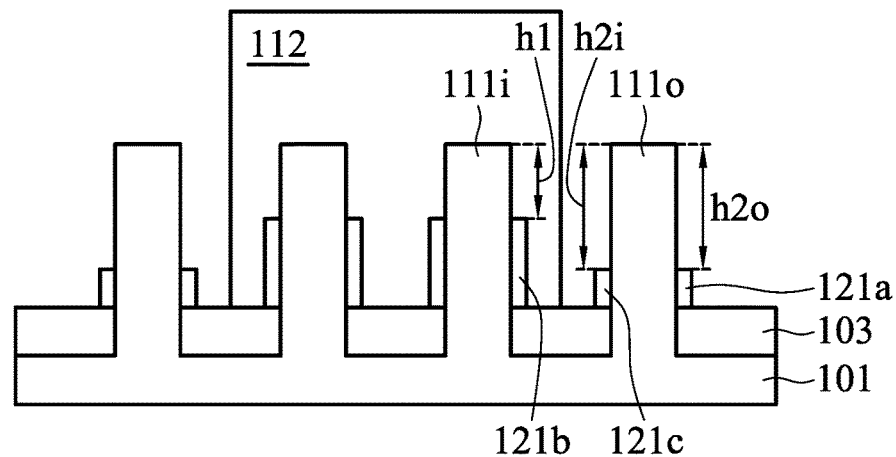
Figures 3, 3A, 4, 5:
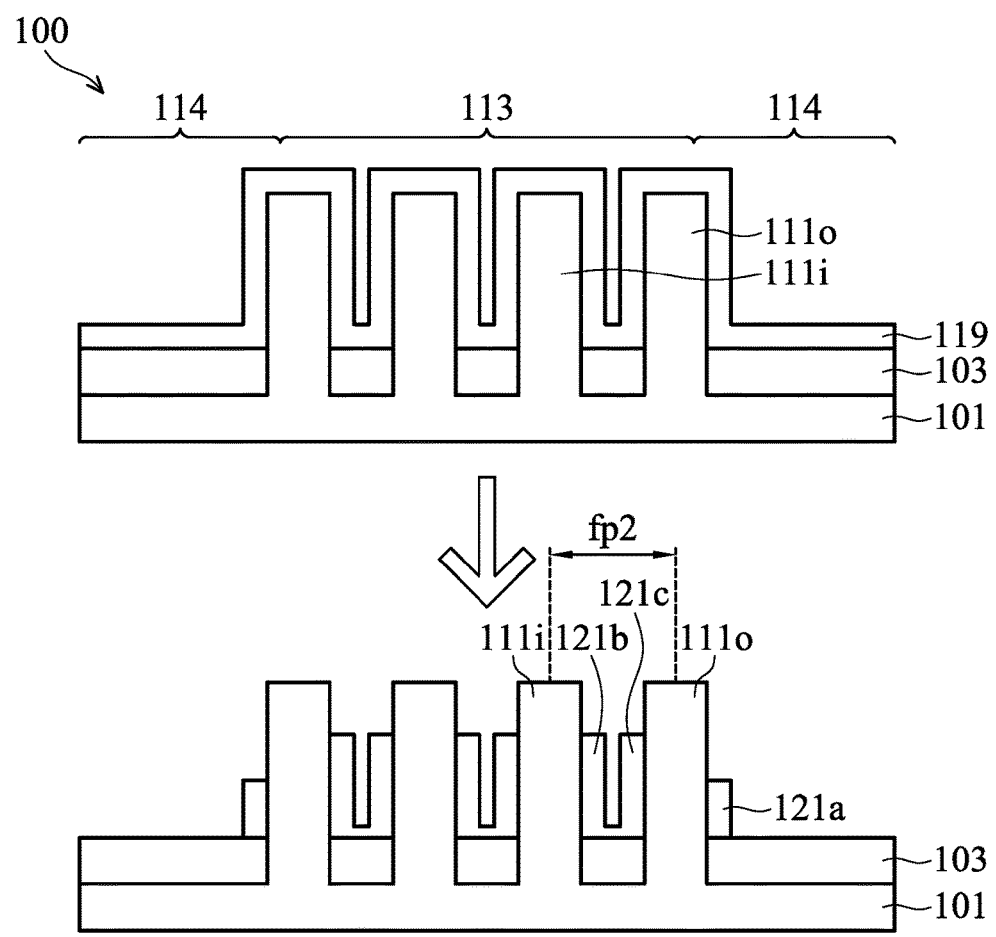
Figures 3, 3A, 4, 5, 6:
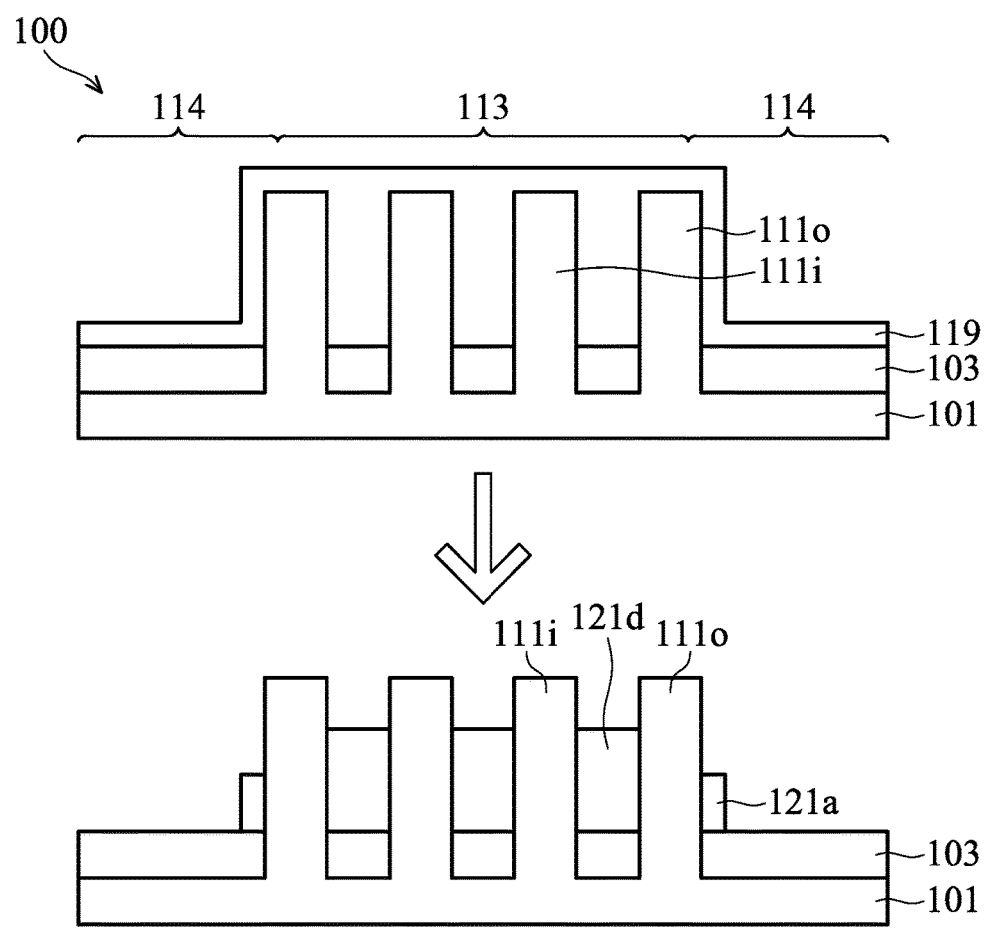
Figures 3, 3A, 4, 5, 6, 7:
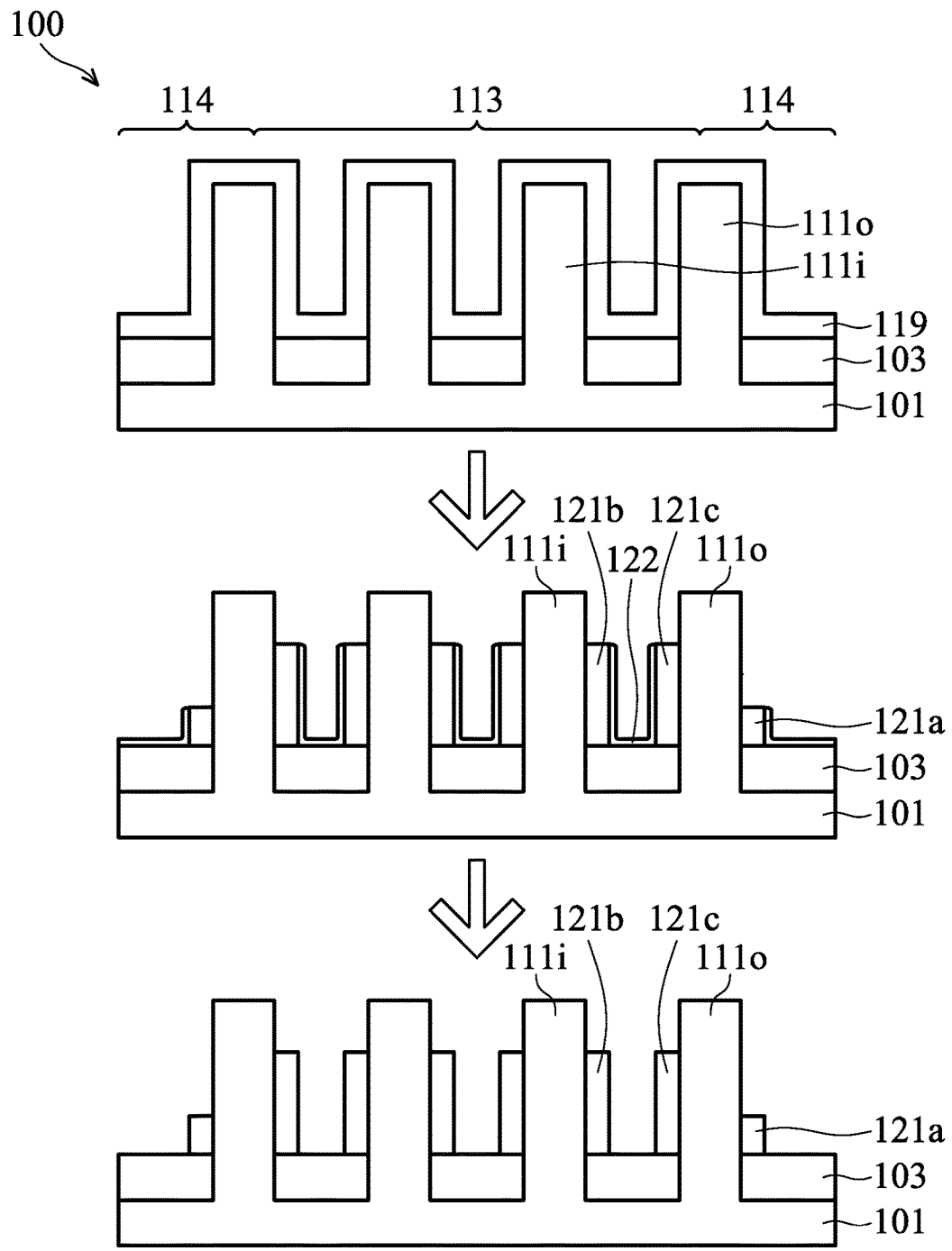

FIGS. 3A-1 through 3A-7 illustrate various methods of forming asymmetric spacers along sidewalls of the fins 111, in accordance with embodiments. In particular, FIGS. 3A-1 through 3A-3 illustrate etching the spacer layer 119 with a mask to form asymmetric spacers 121$a$ and 121$c$ on either side of an outside fin 111$o$; FIG. 3A-4 illustrates etching the spacer layer 119 with another mask to form spacers 121$a$ and 121$c$ having a first height on an outside fin 111$o$ and spacer 121$b$ having a second height on an interior fin 111$i$; FIG. 3A-5 illustrates an etching of the spacer layer 119 to form asymmetric spacers 121$a$ and 121$c$ on either side of an outside fin 111$o$ in a dense fin configuration; FIG. 3A-6 illustrates a processing of the spacer layer 119 to form asymmetric spacers 121$a$ and bridged spacer 121$d$; and FIG. 3A-7 illustrates etching the spacer layer 119 to form asymmetric spacers 121$a$ and 121$c$ on either side of an outside fin 111 by etch tuning.

Referring to FIGS. 3A-1 through 3A-3, the top of spacer layer 119 (of FIGS. 2A and 2B) is anisotropically etched in a first etch to remove horizontal portions of spacer layer 119 from the top of the fins 111 and the top of the STI regions 103 to create spacers 121, as illustrated in FIG. 3A-1. The first etch also recesses the spacers 121 along the sidewalls of the protruding fins 111. The first etch can include any suitable etching technique, for example, an anisotropic technique using $CH_3F/O_2$ plasma etching or another suitable etchant. In some embodiments, some spacer material of spacer layer 119 (see, e.g., FIG. 3A-5) can remain at the bottom of the trench 104 on top of the STI regions 103. For simplicity, the illustrated embodiments will not show this remaining spacer material at the bottom of the trenches 104 unless specifically referenced.

Referring to FIG. 3A-2, in some embodiments a photoresist 112 is deposited over the fin structure and patterned to expose the outer spacers 121 of the outer fins 111o. A first area 113 of the fins is the area between the outer fins 111o. A second area 114 of the fins is the area including the outer spacers of the outer fins 111o. In some embodiments, prior to forming the photoresist 112, a Bottom Anti-Reflective Coating (BARC) (not separately illustrated) is formed over the fins. The BARC can be a conformal or blanketed layer formed of, for example, a dielectric material such as SiON or a spin-on SOC material. The photoresist 112 can be formed over the BARC and patterned. The BARC is patterned using photoresist 112 as an etching mask. The photoresist 112 may be patterned to remain over the first area 113 of the fins and expose the second area 114, of the fins. Accordingly, the outer spacers 121 of the fins 111o are exposed.

Referring to FIG. 3A-3, the exposed outer spacers 121 are recessed by, for example, a second etching to further recess the exposed spacer 121 and form extra-recessed or trimmed spacer 121a. Trimming the spacer 121 to create trimmed spacers 121a can be performed using the same or different etching techniques as used in the first etch. Subsequently, the photoresist 112 and BARC (if used) are removed.

As a result, the outer spacers 121 (now 121a) of the outer fin 111o are etched to expose more of the fin 111o than the inner fin 111i. A height h2 is measured from the top of the outer fin 111o to the bottom of the exposed portion of the outer fin 111o (or the top of recessed spacer 121a). A height h1 is measured from the top of an inner fin 111i to the bottom of the exposed portion of the inner fin 111i (or the top of recessed spacer 121b). In embodiments where the spacer 121c is recessed approximately the same amount as spacer 121b, the height h1 can be measured from the top of the outer fin 111i to the bottom of the exposed inner portion of the outer fin 111o (or the top of recessed spacer 121c). The height h2 is about 10% or more greater than the height of h1. The height of h2 can be about 10 nm to about 100 nm. The height of h1 can be about 8 nm to about 90 nm. In some embodiments, the height h1 can be more than about 100 nm or less than about 10 nm. In some embodiments, the height h2 can be more than about 90 nm or less than about 8 nm.

As explained in detail below, an epitaxial material will be grown over the exposed fins 111i and 111o. The trimmed spacers 121a on the outer side of the outside fin 111o provides a larger surface area of the exposed fin for the epitaxial material to form versus the smaller surface area of the exposed fin, for example on the interior fin 111i. The greater surface area of the will cause the epitaxial material to have a larger volume and larger height on the outside fins. The larger volume and height of the epitaxial material will provide a greater channel mobility of the FinFET device.

FIG. 3A-4 illustrates an embodiment in which the spacer 121c on the inner side surface of the outer fin 111o is extra-recessed or trimmed in a similar manner as the spacer 121a. The illustration of FIG. 3A-4 assumes that a first recess has been done, such as discussed above with regard to FIG. 3A-1. In such embodiments, similar to FIG. 3A-2, discussed above, photoresist 112 and optional BARC can be formed over the fins 111 following the first etch recessing the spacer 121. The photoresist 112 and BARC is patterned to expose the inside and outside spacer 121 of the outside fin 111o. The exposed spacer 121 is then etched by a second etching to further recess the exposed spacer 121 to form extra-recessed or trimmed spacers 121a and 121c. Trimming the spacer 121 to create trimmed spacers 121a and 121c can be performed using the same or different etching techniques as used in the first etch. The photoresist 112 and BARC can then be removed. In some embodiments, the spacer 121c is recessed to approximately the same height as the spacer 121a. The resulting structure is ready for the next processing step, which is discussed in further detail below in FIGS. 4A-8C, and result in a structure similar to that illustrated in FIGS. 9 and 11.

In some embodiments, the spacer 121c may be recessed more than the spacer 121b, but not as much as the spacer 121a. For example, the height h2o of the exposed outer side of the outside fin 111o is about 10% or more greater than the height h1 of the exposed side of the inside fin 111i. The height h2i of the exposed inner side of the outside fin 111o is about 10% or more greater than the height h1 of the exposed side of the inside fin 111i. For example, the height of h2o can be about 10 nm to about 100 nm. The height of h1 can be about 8 nm to about 90 nm. The height h2i can be about 8 nm to about 100 nm. In some embodiments, the height h1 can be more than about 100 nm or less than about 10 nm. In some embodiments, the height h2o can be more than about 90 nm or less than about 8 nm. In some embodiments, the height h2i can be more than about 100 nm or less than about 8 nm.

Because the exposed height h2o on the outer side of the outside fin 111o greater than the height h1 of the exposed inner fin 111i, epitaxial materials formed on the outside fin will be larger and have a greater height than epitaxial materials formed on the inner fin 111i. The exposed height h2i of the outside fin 111o may also have a greater height than the exposed inner fin 111i.

FIG. 3A-5 illustrates an embodiment where the spacing or pitch of the fins is denser. An example embodiment with a denser fin pitch is further discussed below with respect to FIG. 10. For example, the fin pitch fp1 of an embodiment consistent with a less dense spacing, such as illustrated in FIG. 3A-1, can be about 25 nm to about 100 nm. In contrast, the fin pitch fp2 of an embodiment consistent with a denser spacing may be about 15 nm to about 25 nm. A first area 113 of the fins is the area between the outer fins 111o. A second area 114 of the fins includes the outer spacer of the outside fins 111o. Due to the density of the fins in the first area 113, the ability for the etchant to reach the spacer 121 in the first area 113 within the fins 111 can be inhibited. As a result, the spacer 121 in the first area 113 may be etched at a different rate than the spacer 121 in the second area 114. Initially, the etch rate for the first area 113 and the second area 114 may be about the same. As the spacer 121 is recessed between the fins in the first area 113, the etch rate can slow in the first area 113 while remaining the same in the second area 114. For example, the etch rate within the second area may be about 110% to 200% faster than the etch rate within the first area. Thus, the etching can result in the formation of the extra recessed spacer 121a, while the spacers 121b and 121c in the first area are not as recessed.

In some embodiments, some spacer material of spacer layer 119 can remain at the top of the STI regions 103 between the recessed spacer 121b and recessed spacer 121c and form a continuous portion of spacer material between adjacent spacers (e.g., spacer 121b and 121c.

Referring to FIG. 3A-6, in some embodiments, the density of the spacing or pitch of the fins can result in a bridged spacer layer 119 between the fins 111 in the first area 113. In other words, even though the spacer layer 119 is conformally applied, the thickness of the spacer layer 119 results in a bridged spacer because of the density of the fins. For example, the fin pitch of an embodiment consistent with a less dense spacing, such as illustrated in FIG. 3A-1, can be about 25 nm to about 100 nm. In contrast, the fin pitch fp2 (FIG. 3A-5) of an embodiment consistent with a denser spacing may be about 15 nm to about 25 nm, and a spacer layer 119 deposited to a thickness of more than about 10 nm may create a bridged spacer layer as illustrated in FIG. 3A-6. Similar to the discussion above with respect to FIG. 3A-5, different etching rates resulting from the fin density and inhibition of etchant to etch the spacer material in the first area 113, provides an extra-recessed spacer 121a in the second area 114. The spacer 121d between the fins can remain bridged. In some embodiments, a top surface of the spacer 121d can be concave.

Referring to FIG. 3A-7, in some embodiments, the etching can be tuned to achieve different etch rates of the spacer layer 119 in a first area 113 and a second area 114. The first area 113 of the fins is the area between the outer fins 111o. The second area 114 of the fins includes the outer spacer of the outer fins 111o. Tuning the etching can be accomplished, for example, by adjusting the concentrations of the etchant gases to provide a richer or leaner etch process.

Referring to the top illustration of FIG. 3A-7, the spacer layer 119 is formed over and on the sidewalls of the fins and in the bottom of the trenches 104 on top of the STI 103, such as described above with respect to FIG. 2A.

Referring to the center illustration of FIG. 3A-7, in some embodiments, the spacer layer 119 can be etched using a fluorine containing etchant, such as $CH_3F$, to form recessed spacers 121. Etching spacer layer 119 with a fluorine containing etchant may result in a byproduct polymer 122 which can be formed, among other places, at the bottom of trenches 104 and along sides of spacer 121. Polymer 122 can inhibit the etching of the recessed spacers 121. The effect in the first area 113 of inhibiting the etching of the recessed spacers 121 can be greater than the effect in the second area 114 because the first area 113 is more confined than the second area 114 and can contain more polymer byproduct 122. As a result, a first etch rate of the spacer layer 119 can be realized in the first area 113 and a second etch rate can be realized in the second area 114. In some embodiments, the byproduct will form in the first area 113 about 110% to about 200% faster than the byproduct will form in the second area 114, resulting in a first etch rate slower than the second etch rate of the spacer layer 119.

In some embodiments, the buildup of polymer 122 byproduct can be controlled through a simultaneous etch of spacer layer 119 and clean of polymer 122 by adjusting the ratio of the etchant to oxygen. A leaner etch can result in less polymer 122 buildup by simultaneously etching the spacer and cleaning the polymer 122 byproduct. For example, process gasses can include various concentrations of $CHF_3$, $CH_3F$, $O_2$, and $H_2$. The etchant gasses $CHF_3$ and $CH_3F$ provide a fluorine source as the main etchant. The presence of hydrogen affects the rate of polymer 122 buildup. Thus, the rate of polymer 122 buildup can be increased by including $H_2$ as a process gas and using $CH_3F$ for etching, to provide more hydrogen source in etching. The rate of polymer 122 buildup can be decreased by using $CHF_3$ for etching (since it contains less hydrogen concentration versus fluorine concentration per molecule). The rate of polymer 122 buildup can be also be reduced by including $O_2$ as a process gas. The addition of $O_2$ can consume C, for example resulting in $CO_2$, and can consume H, for example resulting in H2O, thereby reducing polymer 122 buildup. Therefore, a higher concentration of etchant gas $CH_3F$ or $CHF_3$ and $H_2$ additive will result in more polymer 122 while a leaner concentration of etchant $CH_3F$ or $CHF_3$ and higher concentration of $O_2$ will result in less polymer 122. By adjusting the concentration of etchant gasses, the amount of polymer 122 can be controlled and therefore the etch rates in the first area 113 can be tuned with respect to the etch rate in the second area 114. For example, the concentration of $CHF_3$ may be greater than the concentration of $CH_3F$ for a polymer lean etch and less than the concentration of CH3F for a polymer rich etch.

Referring to the bottom illustration of FIG. 3A-7, any remaining polymer 122 can be removed by a subsequent dry etch process using $O_2$ plasma or wet clean etch process using a mixture of SCl, $O_3$, and deionized water.

In some embodiments, the etching of spacer layer 119 and cleaning of polymer 122 can be performed in separate steps which are repeated as necessary to achieve the desired spacer 121 profiles.

In some embodiments, etch tuning can be combined with techniques of other embodiments to achieve different etch rates in the first area and the second area. For example, where the etch rates are already different due to the fin pitch being denser, the differences in etch rates can be increased by etch tuning, such as described above.

For any of the above embodiments, the dummy gate structure 130 (see FIG. 2B) having been formed over a channel region of each of the fins 111, the exposed fins may be doped with impurities where the subsequent epitaxial structures of the source/drain regions will be formed. In some embodiments, fins can be doped through the spacer layer 119 prior to the partial removal of the spacer layer 119 described above. In some embodiments, the fins can be doped following the partial removal of the spacer layer 119. For example, although not specifically illustrated, implants for lightly doped source/drain (LDD) regions (not shown) may be performed. P-type impurities, n-type impurities, or both may be implanted. A process for implanting both types of impurities is described, however, only one of such impurity can be implanted if so desired. A mask, such as a photoresist, may be formed over of some of the fins 111, e.g., for p-type devices, while exposing others of the fins 111 to be doped, e.g., for n-type devices, and n-type impurities may be implanted into the exposed fins 111. The n-type impurities may be phosphorus, arsenic, or the like implanted to a desired concentration. After the implant, the mask can be removed, such as by an acceptable ashing process. Subsequently, a mask, such as a photoresist, may be formed over the fins 111 that were previously exposed and implanted with n-type impurities, the mask exposing now others of the fins 111 that were previously masked in the n-type impurity implantation. P-type impurities may be implanted into the exposed fins 111. The p-type impurities may be boron, $BF_2$, or the like implanted to a desired concentration. After the implant, the photoresist can be removed, such as by an acceptable ashing process. After the implants, an anneal may be used to activate the implanted impurities.

Figure 3B:
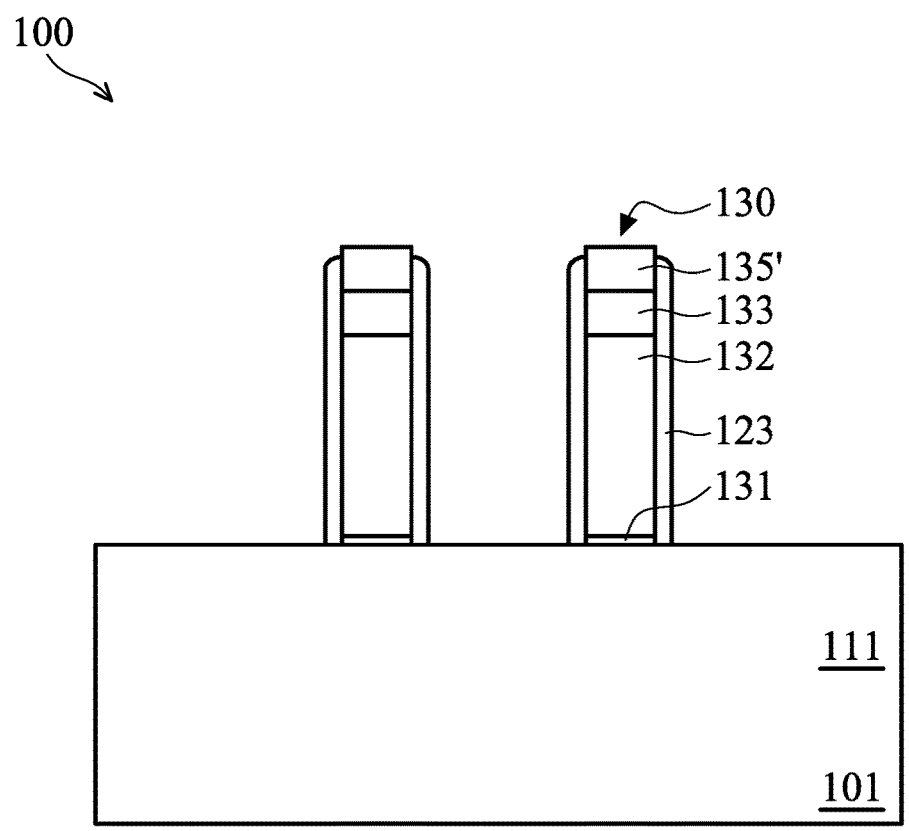

Referring now to FIG. 3B, there is shown a cross-section of the structure of FIG. 3A-3 taken along the length of a fin 111, such as fin 111*i* or 111*o*, providing a cut line similar to the B-B cross-section of FIG. 1. As discussed above, spacer layer 119 is formed over the dummy gate 130 and etched to produce gate spacers 123. In FIG. 3B, the horizontal portions of spacer layer 119 have been removed from atop fin 111 and atop the gate stack 130 by the previously described spacer recessing above (see FIGS. 3A-1 through 3A-7). The gate spacers 123 may have a rounded top surface as a result of the etching. Further, the hard mask 135 may be exposed and partially etched to form hard mask 135' in the same spacer etching process. Hard mask 135' may also have a rounded top surface.

Figure 4A:
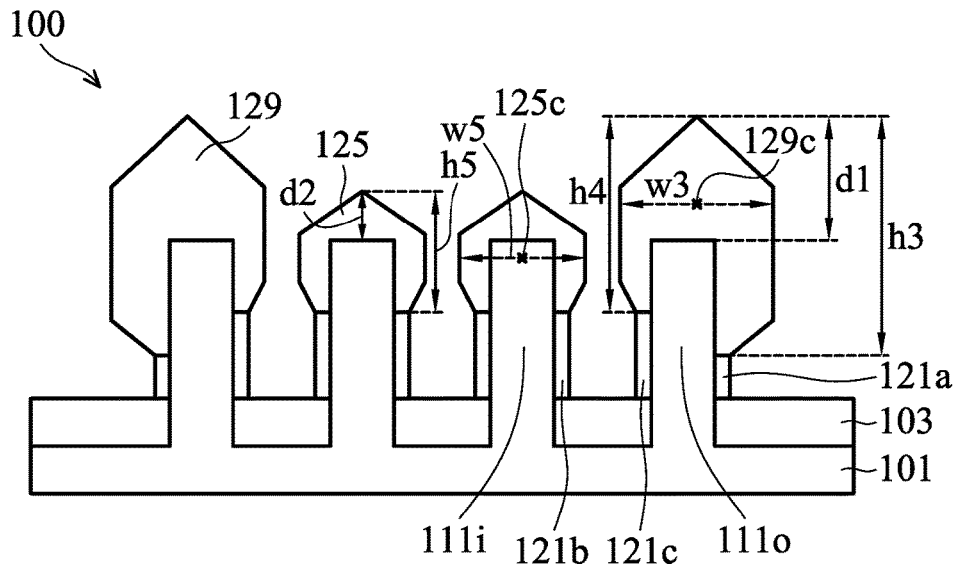

FIG. 4A illustrates the formation of asymmetric epitaxial structures on the fins 111. An epitaxy 125 and epitaxy 129 are grown on the fins 111*o* and 111*i* as illustrated in FIG. 4A. The epitaxial growth can be by any appropriate technique, such as by Metal-Organic Chemical Vapor Deposition (MOCVD), Molecular Beam Epitaxy (MBE), Liquid Phase Epitaxy (LPE), Vapor Phase Epitaxy (VPE), the like, or a combination thereof. The epitaxy 125 and epitaxy 129 can include any material for an acceptable application of the FinFETs to be formed in the source/drain region. For example, the epitaxy 125 and epitaxy 129 may include silicon or silicon germanium, for example. The epitaxy 125 and epitaxy 129 may be formed of a semiconductor material having a first lattice constant different from a second lattice constant of the fins 111. As illustrated in FIG. 4A, the epitaxial growth will result in faceted structures protruding above the previous profile of fins 111*i* and fins 111*o*. The vertical lateral facets of the epitaxial structures 125 and 129 may be substantially parallel to the side of the fins 111*o* and fins 111*i*, within process variations. One of skill will understand the actual shape of the epitaxy 125 and epitaxy 129 may be different than the illustrated epitaxy. For example, if the epitaxy 125 and epitaxy 129 are grown longer, the lateral facet may form toward a point (see, e.g., FIGS. 9-11). The epitaxy will grow on the exposed surfaces of the crystalline fins 111, thus the epitaxy will not grow under the dummy gate stacks 130 or on the spacers 121*a*/121*b*/121*c*.

Due to the recessed spacer 121*a* exposing more of the outer sidewall of fin 111*o* than the sidewall of fin 111*i*, the size and volume of epitaxy 129 grown on fin 111*o* will be greater than the epitaxy 125 grown on fin 111*i*, resulting in an increased overall height, width, volume, and surface area of the epitaxy 129 on fin 111*o*. Due to the difference in epitaxial volume and the increase in epitaxial volume on the outer fins 111*o*, a greater overall strain boost can be accomplished at the source/drain regions of the FinFET, thereby increasing carrier mobility.

Because the spacer 121*a* is recessed more than the spacer 121*c*, in some embodiments, the epitaxy 129 can grow such that the side-to-side centers 129*c* of the epitaxial structures 129 may be offset from the midpoint of the fin 111*o* and may be further toward the outside of the fin 111*o*. In other words, the epitaxy 129 can grow such that the epitaxy is off-center from the fin 111*o*. In some embodiments, when the spacer 121*a* is recessed more than the spacer 121*c*, the epitaxy 129 can grow such that the side-to-side centers 129*c* of the epitaxy is approximately aligned to the center of the fin. The side-to-side centers 125*c* of the epitaxial structures 125 may be approximately aligned to the center of the fin 111*i*.

Height h3 is the height of epitaxy 129 from the recessed spacer 121*a* to the uppermost height of the epitaxy 129. Width w3 is the width of epitaxy 129 at the widest point of the epitaxy 129. Height h4 is the height of epitaxy 129 from the spacer 121*b* to the uppermost height of the epitaxy 129. Height h5 is the height of the epitaxy 125 from the spacer 121*b* to the uppermost height of the epitaxy 125. Width w5 is the width of epitaxy 125 at the widest point of epitaxy 125. An uppermost point of epitaxy 129 is a first distance d1 above the fin 111*o* and an uppermost point of epitaxy 125 is a second distance d2 above the fin 111*i*. Distance d2 is less than distance d1. Height h3 can be about 20 nm to about 100 nm. Height h4 can be about 19 nm to about 95 nm. Height h5 can be about 18 nm to about 90 nm. Width w3 can more than 25 nm. Width w5 can be about 15 nm to about 25 nm. Distance d1 can be more than 10 nm. Distance d2 can be about 5 nm to about 10 nm. These dimensions are provided as examples. Other dimensions may be used.

In some embodiments, the epitaxies 125 and 129 can continue to be grown until the epitaxies 125 and 129 merge together to create a continuous asymmetrical epitaxial structure with a continuous surface, as will be discussed below (see FIGS. 10-11 and 12A). In some embodiments, the spacer 121*c* adjacent to fin 111*o*, proximate to 111*i* can be reduced to about the same height as the spacer 121*a* (extra-recessed), such as described above, and provide more surface area for epitaxy grown on fin 111*o* (see FIG. 11).

Figure 4B:
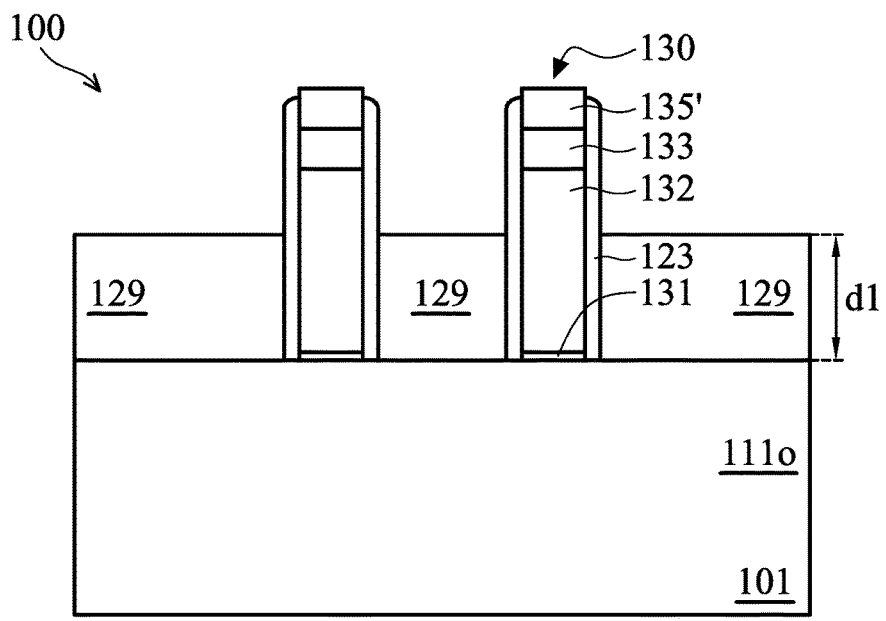

FIG. 4B is a cross-section of the structure of FIG. 4A taken along the length of an outside fin 111*o*, providing a cut line similar to the B-B cross-section of FIG. 1. In FIG. 4B, epitaxy 129 is shown as being a first distance d1 above the fin material.

Figure 4C:
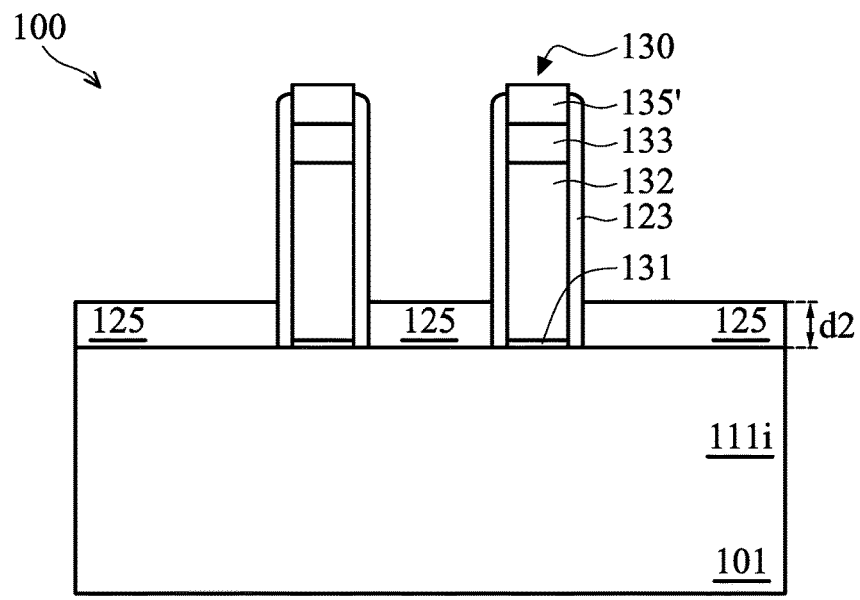

FIG. 4C is another cross-section of the structure of FIG. 4A. The cross-section in FIG. 4C is taken along the length of an inside fin 111*i*, providing a cut line similar to the B-B cross-section of FIG. 1. In FIG. 4C, epitaxy 125 is shown as being a second distance d2 above the fin 111*i*, where the distance d1 of epitaxy 129 in FIG. 4B is greater than the distance d2 of the epitaxy 125 of FIG. 4C. The epitaxial growth of the epitaxy 129 produces a greater volume than the epitaxial growth of the epitaxy 125. It should be understood that the epitaxy 125 and epitaxy 129 shown in cross-sectional view are merely examples and may be configured differently depending on how one recesses the spacers.

The greater volume and height of the epitaxy 129 provides strain on the channel of the device and increased carrier mobility. The greater volume and height of the epitaxy can also provide a greater surface area of the source/drain region of the transistor for the formation of a contact to the source/drain region for decreased resistance.

Figure 5A:
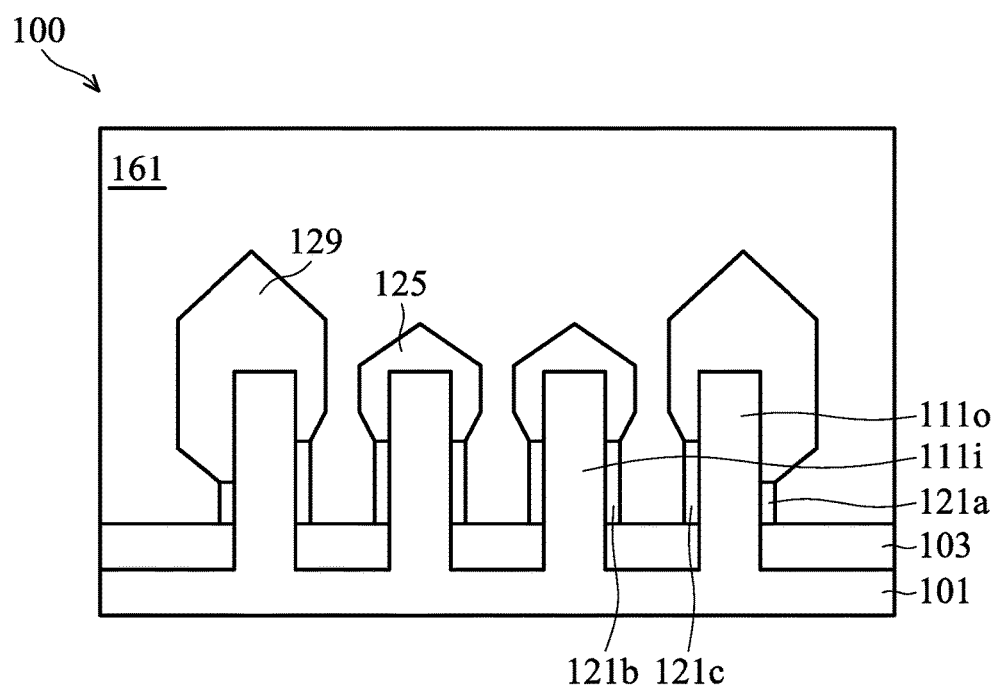
Figure 5B:
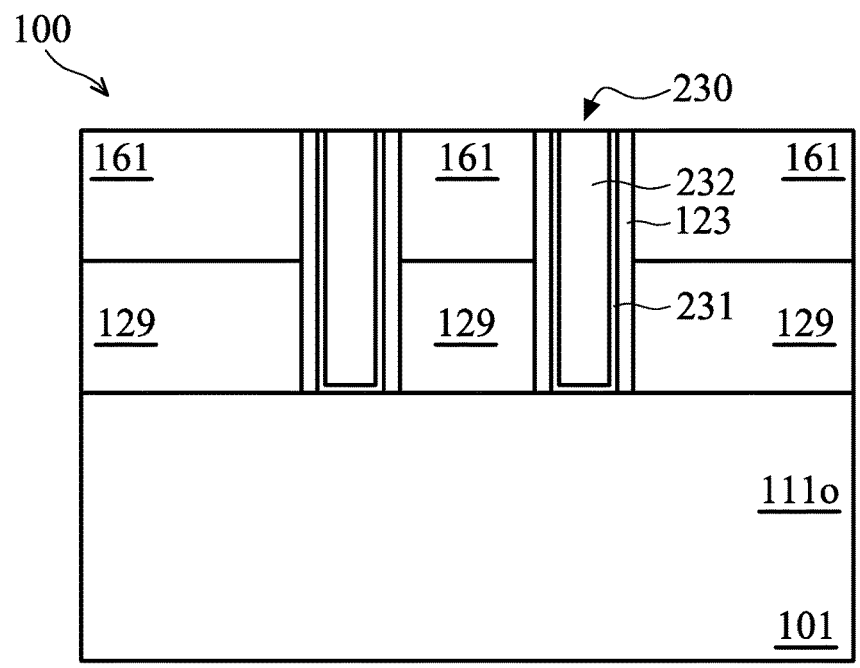
Figure 5C:
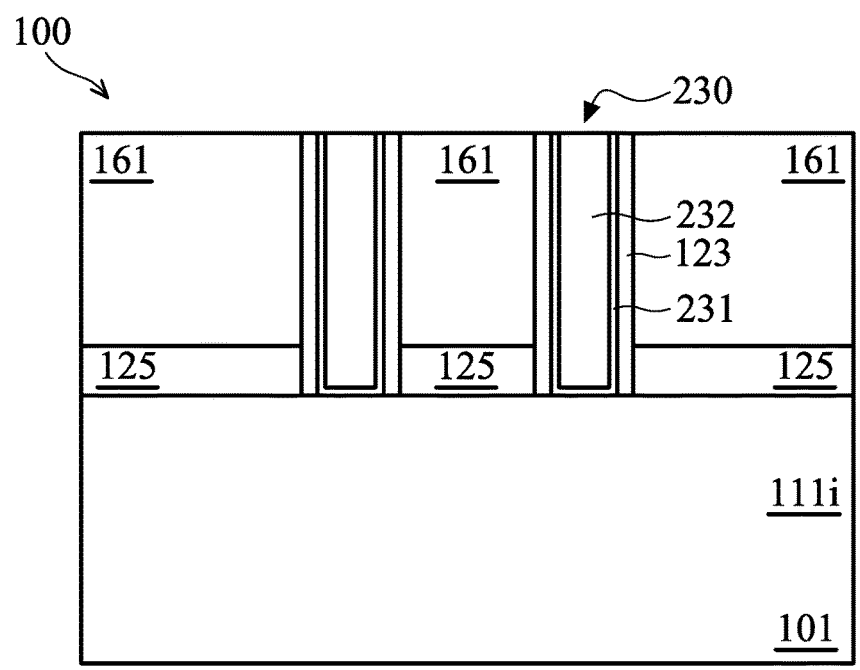

FIG. 5A-5C illustrate a deposition of an interlayer dielectric (ILD) 161. The ILD 161 may comprise a single layer or multiple layers. For example, in some embodiments an ILD liner (not shown) is deposited, and an ILD filler material is deposited over the ILD liner. In some embodiments, the ILD liner comprises $SiO_2$, SiCN, SiON, $Si_3N_4$, and $SiN_xH_y$, but other suitable dielectric materials may be used. The ILD liner may further comprise a plurality of layers that comprise combinations of the above mentioned materials. The ILD liner may be deposited through one or more processes such as PVD, CVD, or ALD, although any acceptable process may be utilized. Other materials and/or processes may be used.

In some embodiments, the ILD filler material comprises $SiO_2$, SiCN, SiOC, SiON, $Si_3N_4$, and $SiN_xH_y$, but other suitable dielectric film may be used. The isolation dielectric may be cured or treated after deposition. For example, the curing may involve irradiation with ultra-violet radiation, and the treatment may involve annealing in $N_2$, $O_2$, or $H_2O$ ambient at temperatures ranging above 200° C. For example, the isolation dielectric may be $SiO_2$ formed by CVD, PECVD or ALD deposition process, FCVD, or a spin-on-glass process. A planarization process, such as a CMP process, may be performed to remove excess materials to form the ILD 161 and to expose dummy gate stack 130 of FIGS. 5B and 5C.

FIGS. 5B and 5C further illustrate a replacement gate stack 230 after the formation of ILD 161 and after replacing the dummy gate stack 130. FIG. 5B is a cross-section of the structure of FIG. 5A taken along the length of an outside fin 111o, providing a cut line similar to the B-B cross-section of FIG. 1. FIG. 5C is another cross-section of the structure of FIG. 5A taken along the length of an interior fin 111i, providing a cut line similar to the B-B cross-section of FIG. 1.

In FIGS. 5B and 5C, ILD 161 is illustrated. The dummy gate stacks 130 of FIGS. 4B and 4C have been removed and replaced with gate stacks 230. The dummy gate removal process may form a recess (not shown) between the gate spacers 123 by removing the hard mask 135', the pad layer 133, the dummy gate electrode 132, and the dummy gate dielectric 131 (see FIGS. 4B and 4C), by one or more selective dry or wet etching processes. Etching can be done using an appropriate etchant and etchant technique, which depends on the material used for the hard mask 135', pad layer 133, dummy gate electrode 132, and dummy gate dielectric 131.

In some embodiments, parts of the dummy gate stack 130, such as the hard mask 135', can be removed mechanically, such as by CMP. For example, in some embodiments, a CMP process can remove the hard mask 135' and pad layer 133 to expose the dummy gate electrode 132. Then the remaining dummy gate electrode 132 can be removed through etching.

A replacement gate stack 230 can be formed within the recess (not shown) between gate spacers 123. If the dummy gate dielectric 131 is not reused, a gate dielectric 231 can be formed over the channel region of the fin 111, such as by deposition or oxidation. The newly formed gate dielectric 231 or reused gate dielectric 231 will be referred to as the replacement gate dielectric 231. The replacement gate dielectric 231 can be a high K dielectric material and can line the gate stack 230 along the sides of spacer 121/gate spacer 143. Over the replacement gate dielectric 231, a replacement gate material 232, such as a metal gate material, can be formed. An optional replacement gate pad layer not shown can be formed over the replacement gate 232.

Other layers may be used in the replacement gate stack 230, which are not shown. For example, work function layers, barrier layers, adhesion layers, and/or the like may also be used. For example, a diffusion barrier layer of titanium nitride (TiN), which may (or may not) be doped with silicon, may be formed over the replacement gate dielectric 231. A work function layer may be formed over the diffusion barrier layer and determine the work function of the gate, and include at least one layer, or a plurality of layers formed of different materials. The specific material of the work function layer may be selected according to whether the respective FinFET is an n-type FinFET or a p-type FinFET. For example, when the FinFET is an n-type FinFET, the work function layer may include a TaN layer and a titanium aluminum (TiAl) layer over the TaN layer. When the FinFET is a p-type FinFET, the work function layer may include a TaN layer, a TiN layer over the TaN layer, and a TiAl layer over the TiN layer. After the deposition of the work function layer(s), a barrier layer, which may be another TiN layer, may be formed.

Figure 6A:
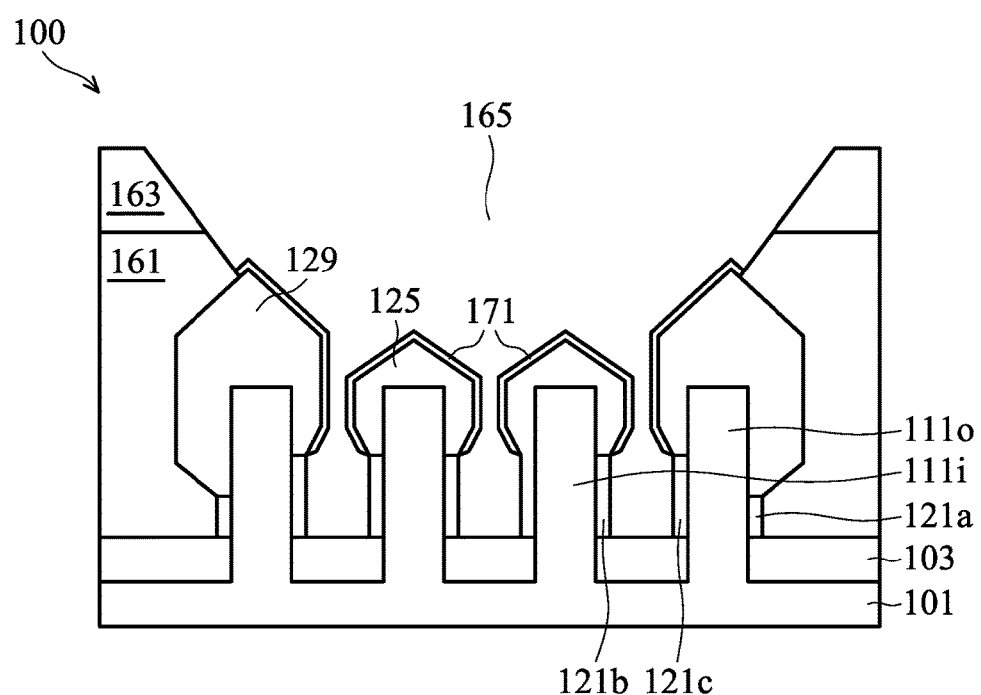
Figure 6B:
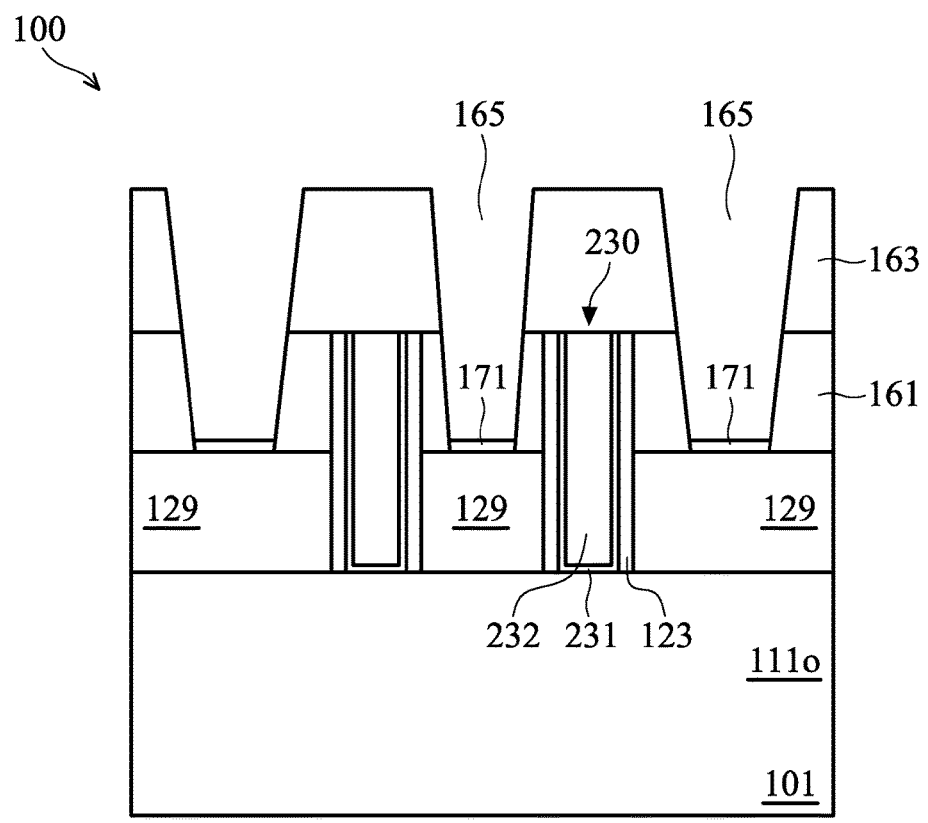
Figure 6C:
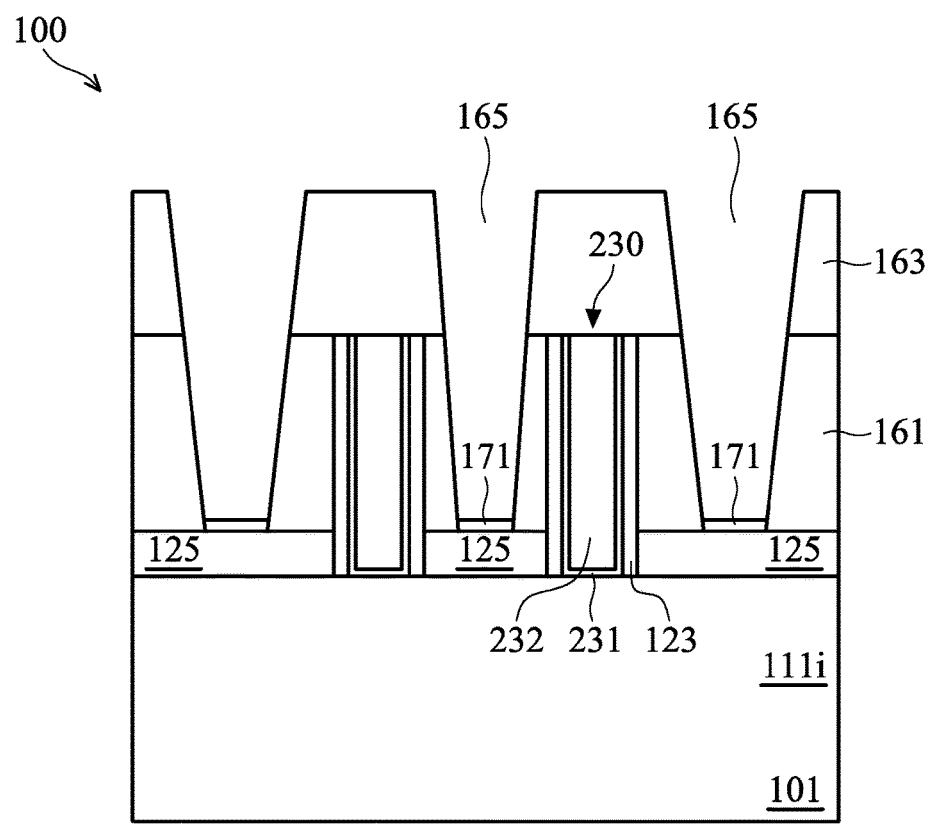

FIGS. 6A-6C illustrate, after formation of a second ILD 163 and after a contact area has been opened, a silicidation of the epitaxy 129 and epitaxy 125 to create silicide contact areas 171. A deposition of a second interlayer dielectric (ILD) 163 can be made in a manner similar to the ILD 161, using processes and materials such those as described above with respect to ILD 161. Contact openings 165 for source/drain contacts can be formed through the ILDs 161 and 163. The contact openings 165 may be formed to expose the epitaxies 125 and 129 using acceptable photolithography and etching techniques. In embodiments in which the ILDs 161 and 163 are formed of silicon oxide, the etch process may be, for example, a dry etch, a chemical etch followed by a wet clean process. Other materials and/or processes may be used.

In some embodiments, the contact openings 165 can expose more or less of the source/drain epitaxies 125 and 129 than illustrated in FIG. 6A.

Silicide 171 can be created by a silicidation process including depositing a metal and annealing the metal to create the silicide 171. For example, a conductive material can be formed in the source/drain contact openings by a conformal deposition. The conductive material may be copper, a copper alloy, silver, gold, tungsten, aluminum, nickel, or a combination thereof, or the like. An anneal process may be performed to form a silicide 171 at and within the surface of the source/drain epitaxies 125 and 129. Due to the size differences of the epitaxy 125 and epitaxy 129, a surface area of the silicide of the outer fin 111o can be greater than the surface area of the silicide of the inner fin 111i, in some embodiments. In some embodiments, excess conductive material following the anneal process can be removed.

In some embodiments, the epitaxy 125 and epitaxy 129 can be merged to form a single asymmetrical epitaxial structure (see FIG. 10), as discussed above with respect to FIG. 4A. In such embodiments, the silicidation process described above can result in a continuous silicide over the single epitaxial structure.

In some embodiments, prior to formation of ILD 163, contact openings (not shown) can be made and a first contact (not shown) formed. A contact etch stop layer (not shown) may be deposited over the ILD 161. The ILD 163 may then be formed as described above and patterned to expose the contact etch stop layer above the first contact. The exposed contact etch stop layer is then removed to expose the first contact. Subsequently, a second contact (not shown) may be formed over the first contact. In such embodiments, the first contact and second contact are in a stacked arrangement. The first contact can be made after the silicidation process described above using processes and materials similar to the contact 181', described below (see FIG. 8A). The second contact can also be made using processes and materials similar to the contact 181', described below (see FIG. 8A).

FIG. 6B is a cross-section of the structure of FIG. 6A taken along the length of an outside fin 111o, providing a cut line similar to the B-B cross-section of FIG. 1. FIG. 6C is another cross-section of the structure of FIG. 6A taken along the length of an interior fin 111i. In FIGS. 6B and 6C, openings 165 are shown and silicide 171 is shown in contact with epitaxy 129 in FIG. 6B and epitaxy 125 in FIG. 6C. The ILD 163 covers the gate stacks 230.

Figure 7A:
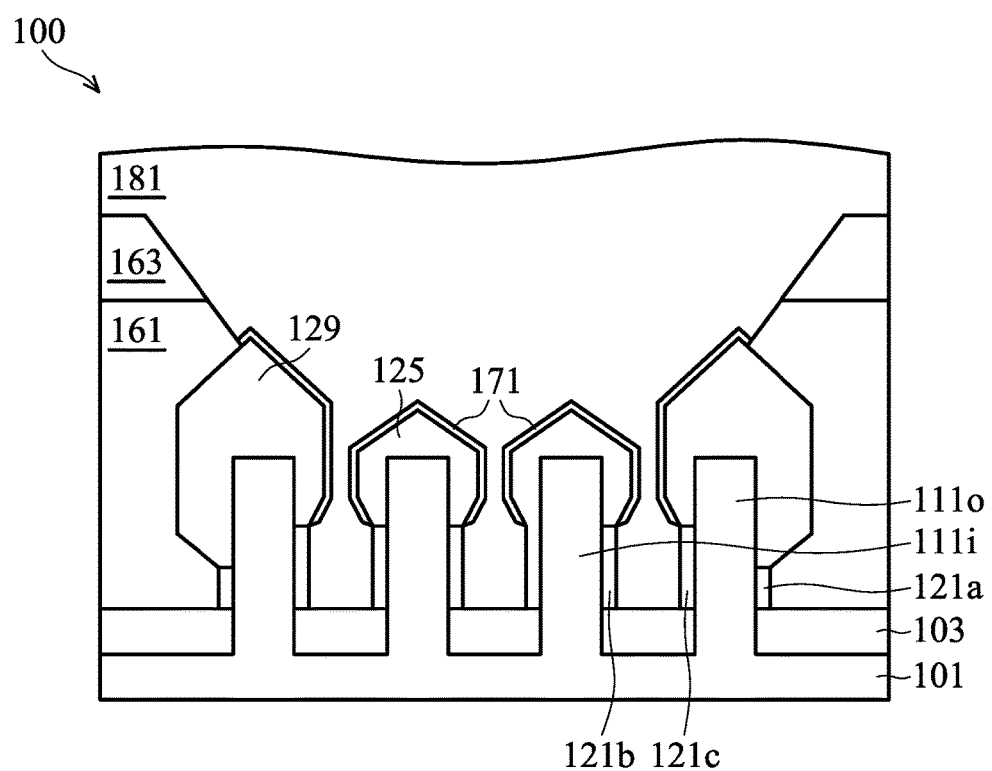
Figure 7B:
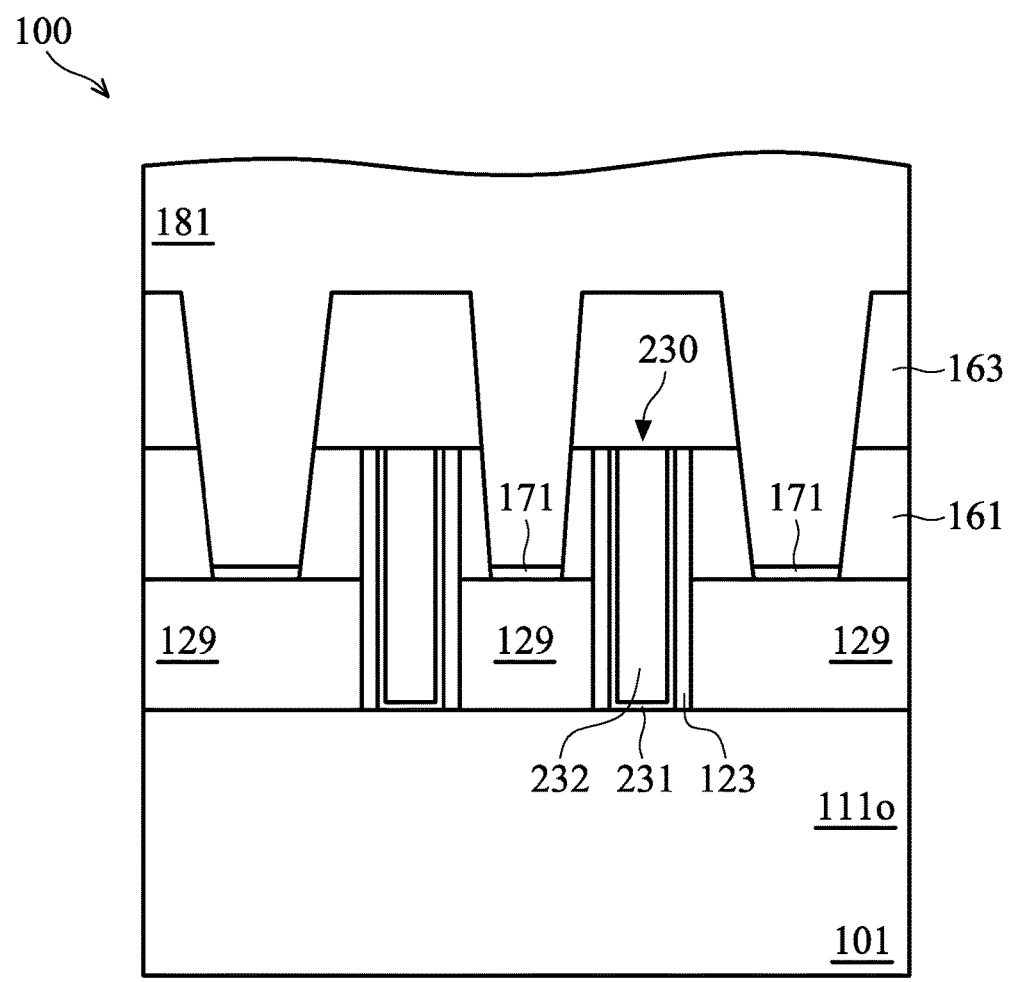
Figure 7C:
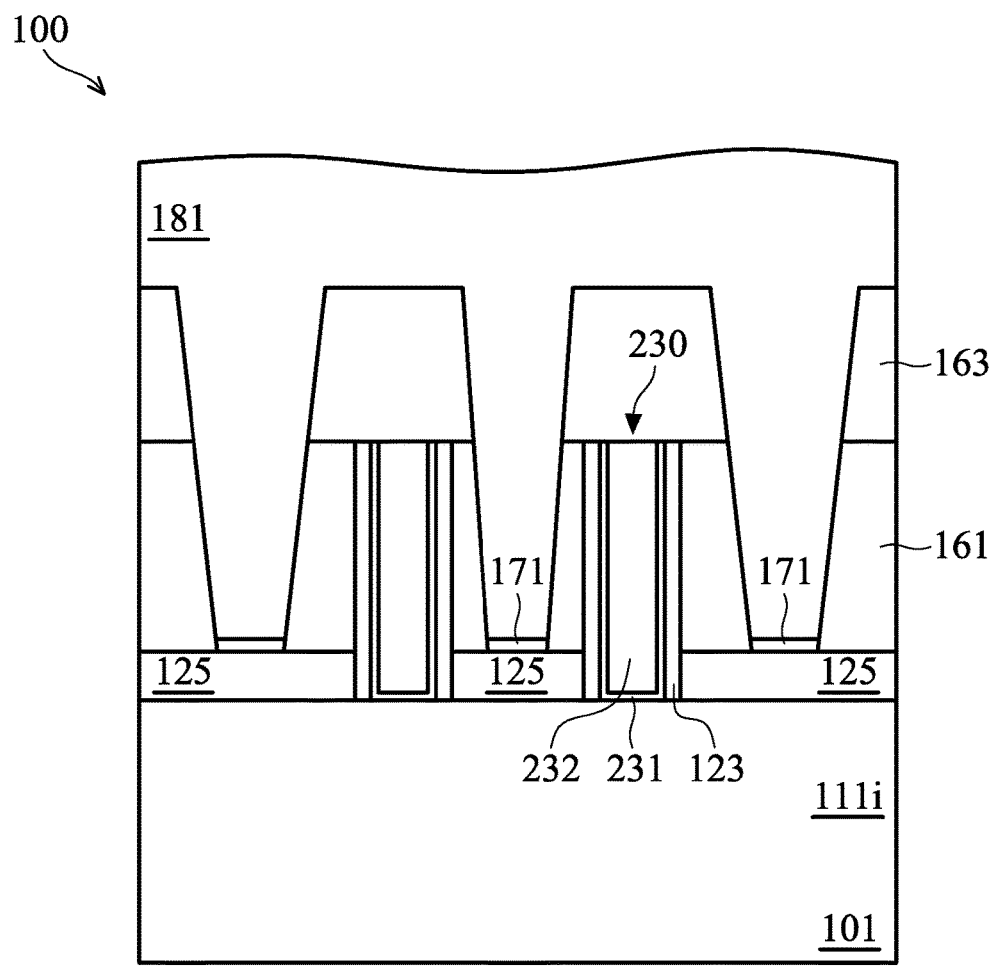

FIGS. 7A-7C illustrate formation of a metal contact material 181 filling the ILD 161 and ILD 163 openings. The metal contact material 181 can include one or more layers of conductive materials such as, copper, a copper alloy, silver, gold, tungsten, aluminum, nickel, or a combination thereof, or the like. The conductive materials can be deposited by any suitable method, such as CVD and PECVD. In some embodiments, the metal contact material 181 can fill in between and below the epitaxy 125 and epitaxy 129 of the fins 111o and 111i, i.e., in the trenches and in contact with the spacers 121b and 121c and top surface of the STI 103. In some embodiments, where the epitaxy 125 and epitaxy 129 are merged into a single epitaxy, the metal contact material 181 may not fill between the fins below the epitaxy 125 and epitaxy 129. The metal contact material 181 can be deposited in excess, causing a topmost surface of the metal contact material 181 to be above the top most surface of the ILD 163.

FIG. 7B is a cross-section of the structure of FIG. 7A taken along the length of an outside fin 111o, providing a cut line similar to the B-B cross-section of FIG. 1. FIG. 7C is another cross-section of the structure of FIG. 7A taken along the length of an interior fin 111i. In FIGS. 7B and 7C, metal contact material 181 is shown as being in excess over the ILD 163.

Figure 8A:
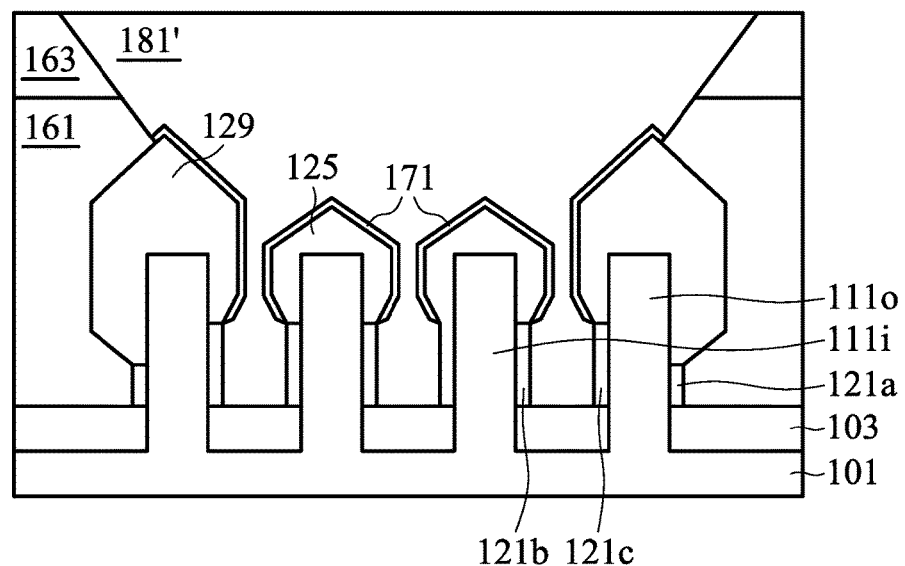
Figure 8B:
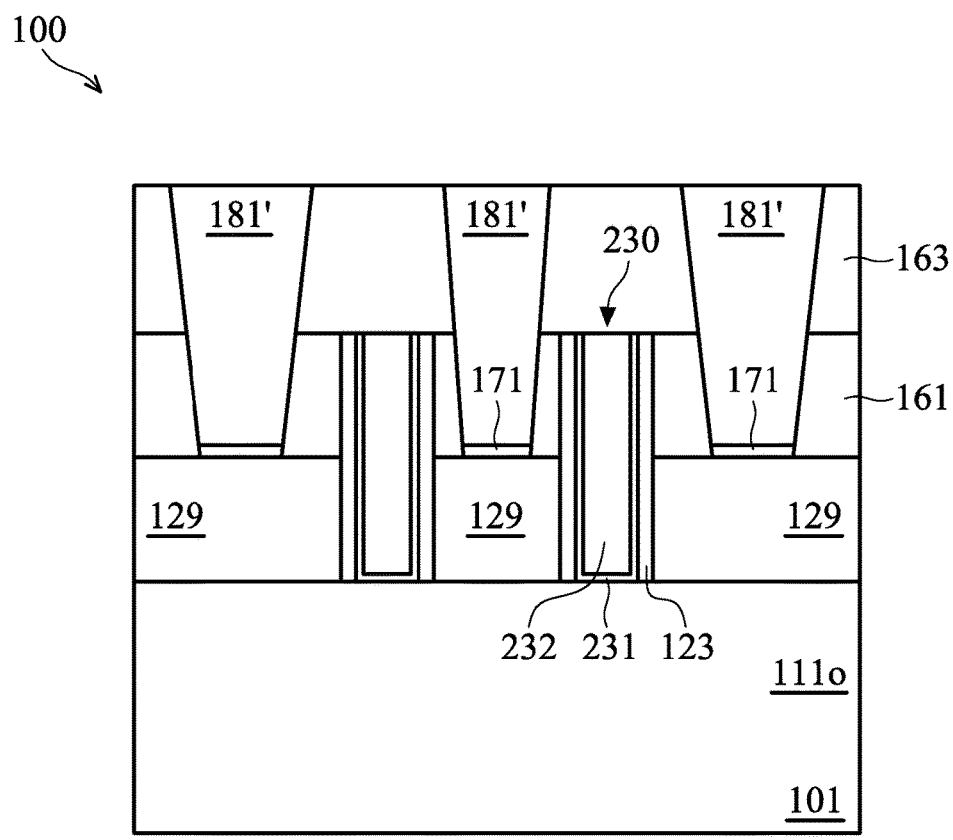
Figure 8C:
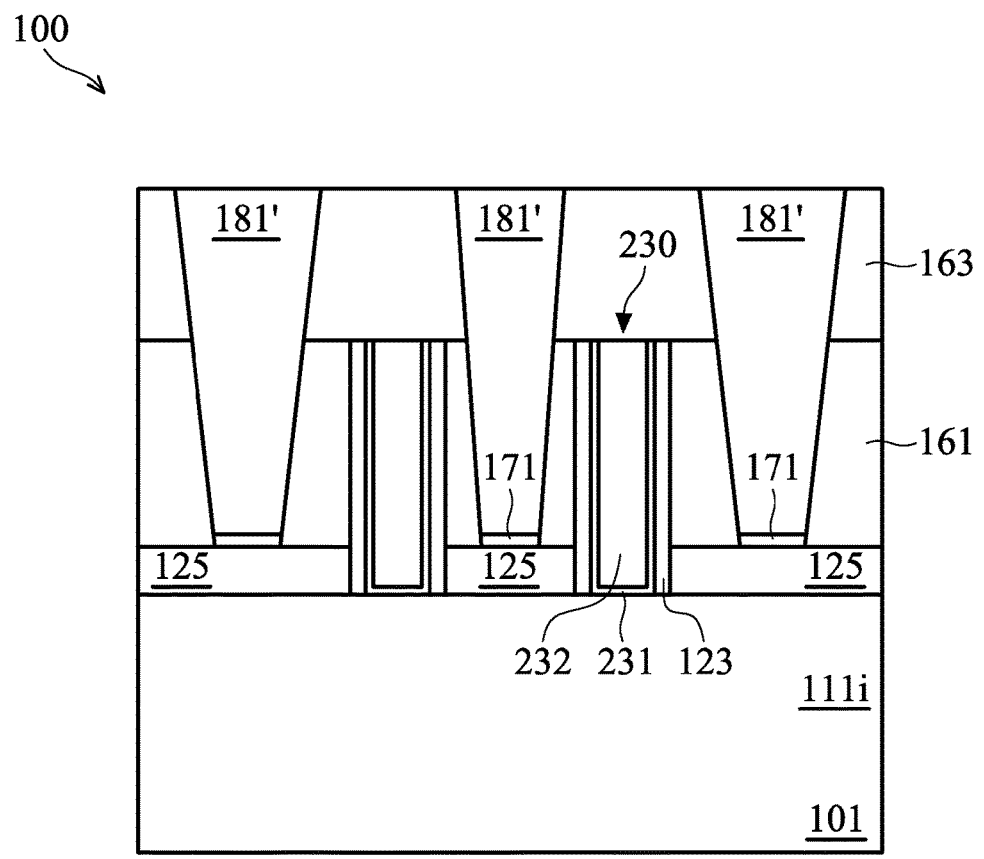

FIGS. 8A-8C illustrate planarization of the metal contact material 181 to produce a planarized metal contact 181'. A planarization process, such as a CMP, may be performed to remove excess material from the metal contact material 181 and to bring the top surface of the metal contact material 181' level with the top surface of the ILD 163 such that they are coplanar. In some embodiments, the planarization process can also remove additional height (or thickness) from the ILD 163 to achieve a desired thickness of the ILD 163.

FIG. 8B is a cross-section of the structure of FIG. 8A taken along the length of an outside fin 111o, providing a cut line similar to the B-B cross-section of FIG. 1. FIG. 8C is another cross-section of the structure of FIG. 8A taken along the length of an interior fin 111i. In FIGS. 8B and 8C, metal contact material 181' is shown as being coplanar with the ILD 163, within process variations.

Figure 9:
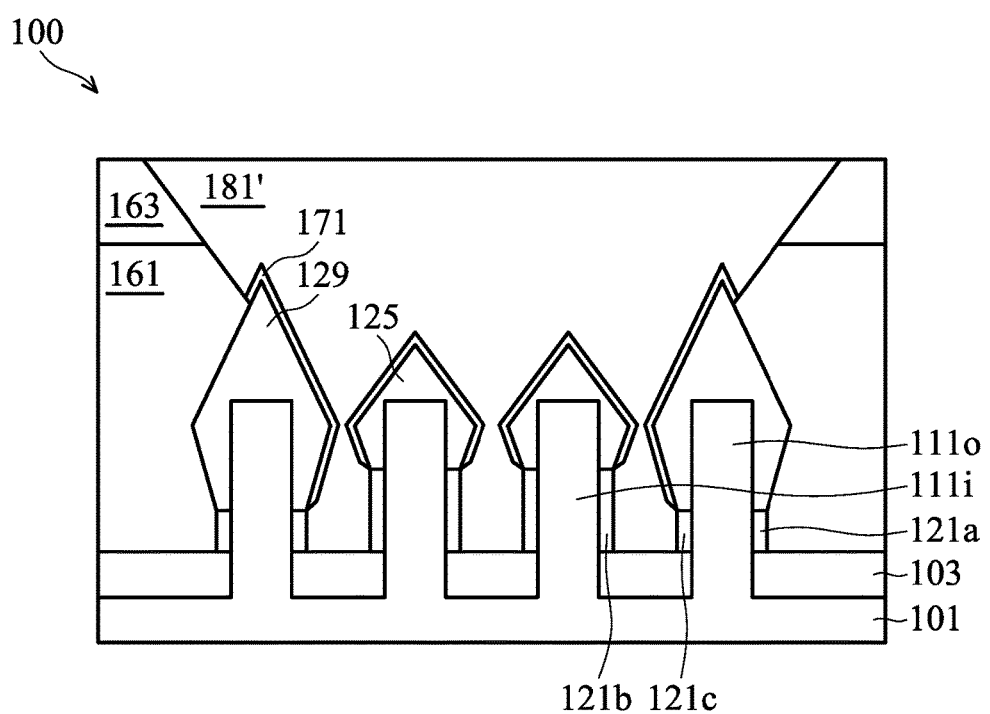
FIGS. 9-11 illustrate various alternative arrangements of the fins and epitaxy of a FinFET, in accordance with some embodiments.

As discussed above, many variations may be made to the above processes. For example, FIGS. 9-11 illustrate various configurations, in accordance with some embodiments. In particular, FIG. 9 illustrates an embodiment where the recessed spacers 121 on both the inner side and outer side of each of the outside fins 111o are extra-recessed or trimmed. FIGS. 10-11 illustrate arrangements of the fins where the epitaxies of the fins 111 are merged into a single asymmetrical epitaxial structure, in accordance with some embodiments. FIG. 10 illustrates an embodiment having a denser fin pitch where the recessed spacers 121 on the outer side of each of the outside fins 111o are trimmed. FIG. 11 illustrates an embodiment having a denser fin pitch where the recessed spacers 121 on both the inner side and outer side of each of the outside fins 111o are trimmed.

Referring first to FIG. 9, an embodiment is illustrated at a stage of processing corresponding to the stage of processing discussed above with respect to FIG. 8A. The embodiment of FIG. 9 illustrates, however, that the recessed spacers 121 on both the inner side (recessed spacer 121c) and outer side (recessed spacer 121a) of each of the outer fins 111o are trimmed or extra-recessed, such as discussed above with respect to FIG. 3A-4. For example, after a first etch to produce the recessed spacers 121 (see FIG. 3A-1), the spacer 121c can be trimmed along with the spacer 121a in a second etch using processes and materials such as discussed above with respect to FIG. 3A-4. The rest of the steps to produce the embodiment of FIG. 9 can proceed as discussed above with respect to FIGS. 4A-8C, and are not repeated.

As discussed above with respect to FIG. 4A, the epitaxial structures can be of a different shape than depicted in FIGS. 4A through 8C. FIGS. 9 through 11 illustrate epitaxial structures which have sidewalls that come out to a lateral point. One should understand that other shapes of the epitaxial structures 125 and 129 may also occur and are contemplated by the present disclosure.

Figure 10:
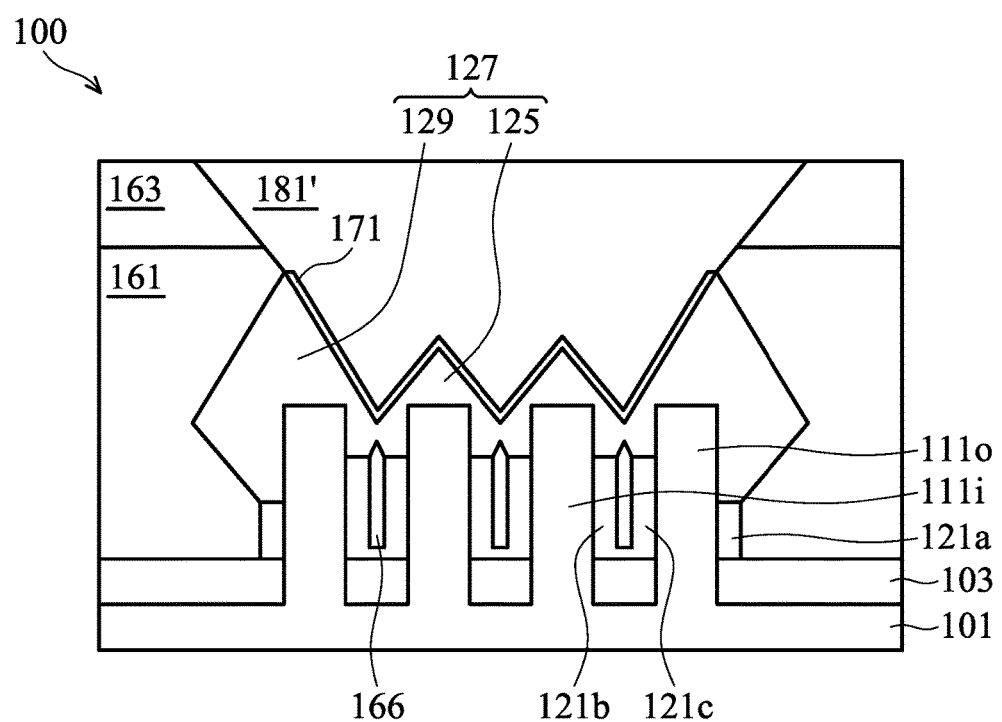

Referring to FIG. 10, an embodiment is illustrated at a stage of processing corresponding to the stage of processing discussed above with respect to FIG. 8A. The embodiment of FIG. 10 illustrates, however, that the fin pitch of the fins 111 have a denser design than in other embodiments where the fin pitch is less dense, such as discussed above with respect to FIGS. 3A-5. The recessed spacers 121a on the outer sides of the outer fins 111o are trimmed or extra-recessed, such as discussed above with respect to FIG. 3A-5. For example, after the spacer layer 119 has been formed (see top illustration of FIG. 3A-5), an etching can produce the recessed spacers 121b and 121c and the trimmed or extra-recessed spacer 121a (see bottom illustration of FIG. 3A-5), using processes and materials as described above. The rest of the steps of the embodiment illustrated by FIG. 10 can proceed as discussed above with respect to FIGS. 4A-8C, and are not repeated.

FIG. 10 illustrates a single asymmetrical epitaxial structure 127 comprising merged large epitaxies 129 and small epitaxies 125. For any of the embodiments discussed herein, the epitaxies 125 and 129 can grow respectively outward until they meet and merge into a single epitaxial structure 127. When the fin pitch is denser, because the epitaxies start growing closer together, the respective epitaxies 125 and 129 may more readily merge to form a merged epitaxial structure 127. (See, for example, the discussion of the fin pitch above, with respect to FIG. 3A-5.) When the fin pitch is less dense, the epitaxies 125 and 129 may also merge to form a merged epitaxial structure 127 if they are epitaxially grown to a large enough size, e.g., the side-to-side width (see FIG. 4A, widths w3 and w5) of the epitaxies 125 and 129 are greater than the fin pitch of fins 111.

When the epitaxies 125 and 129 are merged to form the single epitaxial structure 127, a void 166 may be formed between the spacers 121b and 121c and below the merged epitaxial structure 127. In some embodiments, the void 166 is filled or partially filled with material by access from openings (not shown) in the trenches 104 at the distal end of the fins 111. For example, the void 166 can be filled with material in the formation of ILD 161 or can be filled with material from a subsequent oxidation or etching process which may result in material being formed in the void 166. In some embodiments, the void 166 remains an air pocket.

In another embodiment, the illustration of FIG. 10 may be altered to include the spacer arrangement as depicted above with respect to FIG. 3A-6. For example, the spacers 121b and 121c of FIG. 10 may be bridged to produce spacer 121d, such as illustrated in FIG. 3A-6. The resulting spacers 121d and 121a can be formed, using process and materials as described above with respect to FIG. 3A-6. The rest of the steps can proceed as discussed above with respect to FIGS. 4A-8C, and are not repeated.

Figure 11:
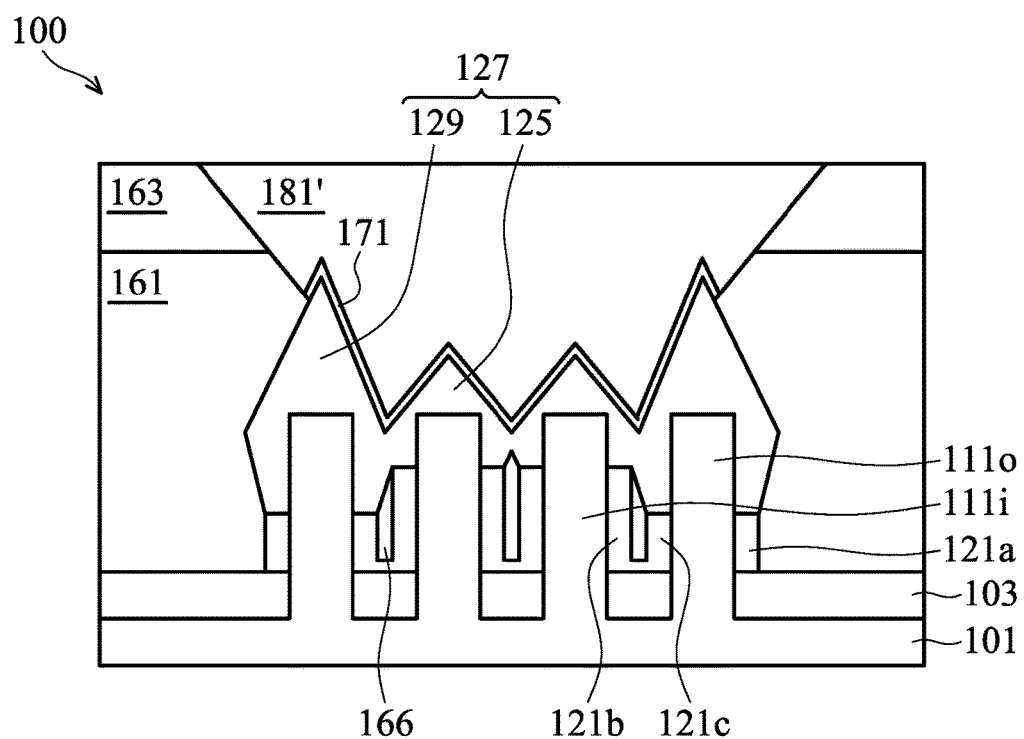

Referring to FIG. 11, an embodiment is illustrated at a stage of processing corresponding to the stage of processing discussed above with respect to FIG. 8A. The embodiment of FIG. 11 illustrates a denser fin pitch and merged epitaxial structure 127, such as discussed above with respect to FIG. 10. The embodiment of FIG. 11 illustrates that the recessed spacers 121 on both the inner side (recessed spacer 121c) and outer side (recessed spacer 121a) of each of the outer fins 111o are trimmed or extra-recessed, such as discussed above with respect to FIG. 9. The rest of the steps of the embodiment illustrated by FIG. 11 can proceed as discussed above with respect to FIGS. 4A-8C, and are not repeated.

Although the above process and resulting device has been illustrated with four fins, one of skill in the art will understand that the described process can be used to provide a FinFET with other numbers of fins, including two, three, five, six, etc. fins.

Figure 12A:
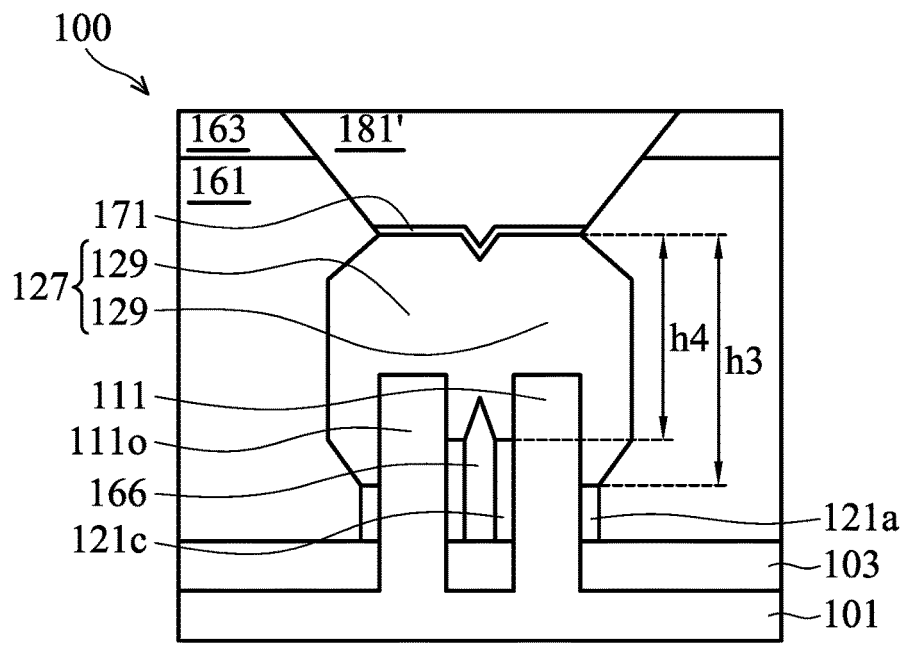
FIGS. 12A-12B illustrate various alternative arrangements of the fins of a FinFET, in accordance with some embodiments.
Figure 12B:
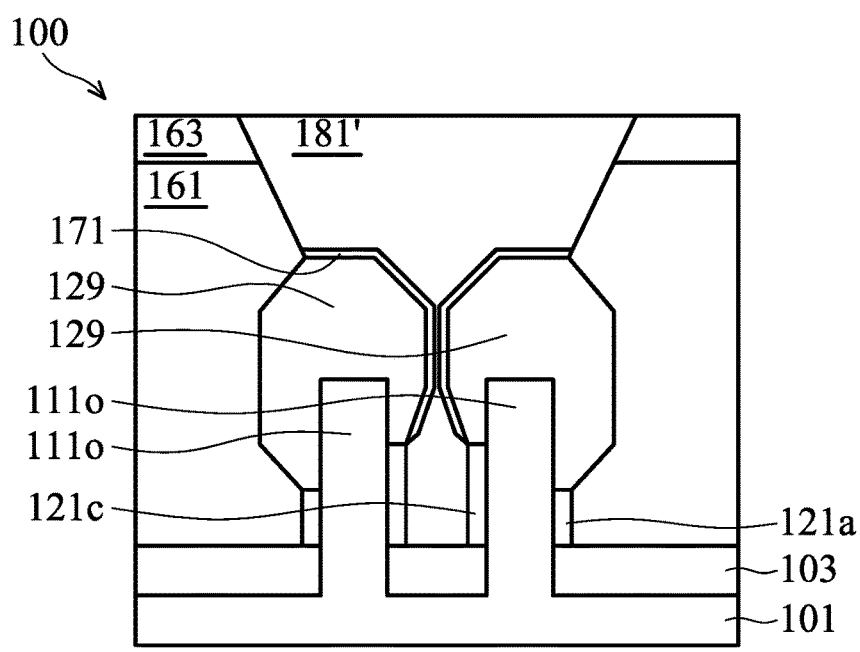

FIGS. 12A and 12B illustrate a FinFET structure having two fins, in accordance with some embodiments. The structures depicted in FIGS. 12A and 12B have two outer fins (labeled as fins 111o), such as described in embodiments above, see, e.g., FIGS. 4A-8C. The outer spacers 121a may extra-recessed or trimmed in accordance with the any of the processes and materials discussed above with respect to FIGS. 3A-1 through 3A-3 and FIGS. 3A-5 through 3A-7. The inner spacers 121c are recessed less than the outer spacers 121a. The overall height h3 of the epitaxy 129 can be the same on both the outer fins 111o. Due to the extra-recessed spacer 121a, however, the epitaxial structure 129 is asymmetrical over each fin, having an outer height h3 which is greater than the inner height h4, such as discussed above with respect to FIG. 4A. As a result, the height and volume of the epitaxial structure 129 is greater than if the spacer 121a were not extra-recessed, and more strain may be produced on the source/drain region of the transistor, improving carrier mobility.

FIG. 12A illustrates an embodiment where the fin pitch is denser and the epitaxial growth is larger due to the recessed spacers 121a. The epitaxies 129 are merged into a single epitaxial structure 127, such as described above with respect to FIG. 10. The rest of the steps of the embodiment illustrated by FIG. 12A can proceed as discussed above with respect to FIGS. 4A-8C, and are not repeated.

FIG. 12B illustrates an embodiment where the fin pitch is less dense and the epitaxial growth is larger due to the recessed spacers 121a. The epitaxies 129 are two distinct epitaxies. The rest of the steps of forming the embodiment illustrated by FIG. 12B can proceed as discussed above with respect to FIGS. 4A-8C, and are not repeated.

One of skill will understand that the final shape of the epitaxies 129 of FIGS. 12A and 12B can be different from the shape depicted. For example, the shape can be more like the shape depicted in FIGS. 4A-8C. Or, for example, the epitaxies 129 of FIG. 12A can be merged less completely together, such as depicted in FIGS. 10-11.

One of skill will understand that a structure similar to those discussed above with respect to FIGS. 2A-12B, except containing a different number of fins, can be formed using processes and materials discussed above. For example, a three fin structure will have two outer fins 111o and one inner fin 111i. Similarly, a five fin structure will have two outer fins 111o and three inner fins 111i. In general, a structure having n number of fins will have two outer fins 111o and n-2 inner fins 111i.

Embodiments can produce an asymmetric epitaxial source/drain structures. A higher and larger outer epitaxial height/volume can boost the overall strain effect, resulting in increased carrier mobility. In some embodiments the fin spacer on both sides of the outside fin can be recessed, while in other embodiments just the outer spacer of the outside fin can be recessed, to expose more of the fin for epitaxial growth and increased volume of the outer epitaxy. The asymmetrical epitaxy can also provide a greater surface area to lower resistivity of a contact to the source/drain region formed by the epitaxy.

One embodiment is a method that includes forming a plurality of fins on a substrate where each of the plurality of fins has a top and sidewalls. A dummy gate structure is formed over the plurality of fins. A conformal spacer layer is formed over a top and sidewalls of the dummy gate structure and over the top and sidewalls of the plurality of fins. The spacer layer is recessed to form asymmetrically recessed spacers abutting and covering lower portions of each of the plurality of fins thereby exposing a portion of each of the plurality of fins on opposing sides of the dummy gate structure. A source/drain epitaxy is epitaxially grown on each of the exposed portions of the plurality of fins, resulting in a first source/drain epitaxy on a first fin that is asymmetrical to a second source/drain epitaxy on a second fin.

One embodiment is a method which includes forming a plurality of fins on a substrate. A gate structure is formed over a channel region of the plurality of fins. A spacer material is deposited over the fins and in between the fins in a source/drain region of the fins. The spacer material is recessed to expose a top portion of the fins, where the recessing includes, recessing the spacer material of a first fin to expose an outer side of the first fin by a first height, and recessing the spacer material of a second fin to expose a first side of the second fin by a second height. The first height is greater than the second height. A first epitaxy is grown over exposed surfaces of the first fin and a second epitaxy is grown over exposed surfaces of the second fin, where the height of the first epitaxy is greater than a height of the second epitaxy.

One embodiment is a device that includes a semiconductor substrate having a first fin and a second fin adjacent to the first fin, where the first fin and the second fin hare parallel to each other. The device has a gate structure formed over the first and second fins, the gate structure being perpendicular to a lengthwise direction of the first fin. A first epitaxy is formed over the first fin on a first side of the gate structure. A second epitaxy is formed over the second fin on the first side of the gate structure. A height of the first epitaxy is greater than a height of the second epitaxy.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a plurality of fins on a substrate, each of the plurality of fins having a top and sidewalls;
   forming a dummy gate structure over the plurality of fins;
   forming a spacer layer over a top and sidewalls of the dummy gate structure and over the top and sidewalls of the plurality of fins;
   recessing the spacer layer to form asymmetrically recessed spacers along sidewalls of each of the plurality of fins, thereby exposing a portion of each of the plurality of fins on opposing sides of the dummy gate structure; and
   epitaxially growing a source/drain epitaxy on each of the exposed portions of the plurality of fins, wherein a first source/drain epitaxy on a first fin is asymmetrical to a second source/drain epitaxy on a second fin.

2. The method of claim 1, wherein recessing the spacer layer to form asymmetrically recessed spacers comprises:
performing a first etch to substantially uniformly recess the spacer layer on each of the plurality of fins;
forming a mask over one or more fins of the plurality of fins, the mask covering a first set of recessed spacers; and
performing a second etch to further recess a second set of recessed spacers.

3. The method of claim 2, wherein the second set of recessed spacers comprises an inner spacer and outer spacer of each outer fin of the plurality of fins.

4. The method of claim 2, wherein the second set of recessed spacers includes only an outer spacer of each outer fin of the plurality of fins.

5. The method of claim 1, wherein recessing the spacer layer comprises:
forming a first set of spacers of the asymmetrically recessed spacers by etching the first set of spacers at a first etch rate; and
forming a second set of spacers of the asymmetrically recessed spacers by etching the second set of spacers at a second etch rate, wherein the first etch rate is slower than the second etch rate.

6. The method of claim 5, wherein a concentration of etchant gasses is lowered to achieve the first etch rate.

7. A method, comprising:
forming a plurality of fins on a substrate;
forming a gate structure over the plurality of fins;
depositing a spacer material over the plurality of fins and between the plurality of fins in a source/drain region of the plurality of fins;
recessing the spacer material to expose a top portion of each of the plurality of fins, the recessing comprising:
recessing the spacer material of a first fin of the plurality of fins to expose an outer side of the first fin by a first height, and
recessing the spacer material of a second fin of the plurality of fins to expose a first side of the second fin by a second height, wherein the first height is greater than the second height; and
epitaxially growing a first epitaxy over exposed surfaces of the first fin and a second epitaxy over exposed surfaces of the second fin, wherein a height of the first epitaxy is greater than a height of the second epitaxy.

8. The method of claim 7, wherein recessing the spacer material to expose the top portion of the plurality of fins further comprises:
in a first etch, etching the spacer material to reduce the spacer material below a top surface of the fins;
forming a resist over the fins;
patterning the resist to expose the outer side of the first fin; and
in a second etch, etching the spacer material of the outer side of the first fin.

9. The method of claim 7, wherein recessing the spacer material to expose the top portion of the plurality of fins further comprises:
etching the spacer material to reduce the spacer material below a top surface of the fins;
etching the spacer material between the plurality of fins at a first etch rate; and
etching the spacer material at the outer side of the first fin at a second etch rate, wherein the first etch rate is less than the second etch rate.

10. The method of claim 9, wherein a concentration of etchant gasses is lowered to achieve the first etch rate.

11. The method of claim 7, further comprising:
depositing an interlayer dielectric (ILD) over the gate structure, the first epitaxy, and the second epitaxy;
forming an opening in the ILD over one or more of the first epitaxy and the second epitaxy; and
forming a contact electrically coupled to the first epitaxy and the second epitaxy.

12. A method, comprising:
patterning a substrate to form a plurality of semiconductor strips in the substrate;
depositing a spacer layer over tops and sidewalls of the plurality of semiconductor strips;
removing a portion of the spacer layer disposed on the tops of the plurality of semiconductor strips;
recessing a portion of the spacer layer abutting a first sidewall of a first strip of the plurality of the semiconductor strips forming a first recessed spacer, an exposed portion of the first sidewall above the first recessed spacer having a first height;
recessing a portion of the spacer layer abutting a second sidewall of the first strip forming a second recessed spacer, an exposed portion of the second sidewall above the second recessed spacer having a second height;
recessing a portion of the spacer layer abutting a third sidewall of a second strip of the plurality of semiconductor strips forming a third recessed spacer, an exposed portion of the third sidewall above the third recessed spacer having a third height, wherein the second strip is immediately adjacent the first strip, and wherein the third height is less than the first height; and
growing a first epitaxy on the first strip and a second epitaxy on the second strip.

13. The method of claim 12, wherein a volume of the first epitaxy is larger than a volume of the second epitaxy.

14. The method of claim 13, wherein the first epitaxy is merged with the second epitaxy.

15. The method of claim 13, wherein the second height and first height are the same.

16. The method of claim 12, wherein the second height is less than the first height, and wherein the first epitaxy and second epitaxy have a same size.

17. The method of claim 16, wherein the first epitaxy is merged with the second epitaxy.

18. The method of claim 12, further comprising:
forming a first silicide over the first epitaxy; and
forming a second silicide over the second epitaxy, wherein the first silicide has a greater surface area than the second silicide.

19. The method of claim 12, wherein recessing the portion of the spacer layer abutting the first sidewall and at least part of recessing the portion of the spacer layer abutting the third sidewall is performed simultaneously.

20. The method of claim 19, wherein recessing the portion of the spacer layer abutting the first sidewall is performed at a first etch rate and recessing the portion of the spacer layer abutting the third sidewall is performed at a second etch rate, wherein the first etch rate is faster than the second etch rate.

* * * * *